(12) United States Patent
Lilak et al.

(10) Patent No.: US 11,075,202 B2
(45) Date of Patent: Jul. 27, 2021

(54) BOTTOM FIN TRIM ISOLATION ALIGNED WITH TOP GATE FOR STACKED DEVICE ARCHITECTURES

(71) Applicant: INTEL CORPORATION, Santa Clara, CA (US)

(72) Inventors: Aaron D. Lilak, Beaverton, OR (US); Gilbert Dewey, Beaverton, OR (US); Willy Rachmady, Beaverton, OR (US); Patrick Morrow, Portland, OR (US); Rishabh Mehandru, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/650,155

(22) PCT Filed: Jan. 10, 2018

(86) PCT No.: PCT/US2018/013138
§ 371 (c)(1),
(2) Date: Mar. 24, 2020

(87) PCT Pub. No.: WO2019/139572
PCT Pub. Date: Jul. 18, 2019

(65) Prior Publication Data
US 2021/0074704 A1    Mar. 11, 2021

(51) Int. Cl.
*H01L 27/092* (2006.01)
*H01L 29/06* (2006.01)
(Continued)

(52) U.S. Cl.
CPC ...... *H01L 27/0924* (2013.01); *H01L 29/0649* (2013.01); *H01L 29/41791* (2013.01); *H01L 29/785* (2013.01)

(58) Field of Classification Search
CPC ............. H01L 27/0924; H01L 27/0688; H01L 29/0649; H01L 29/41791; H01L 29/785;
(Continued)

(56) References Cited

U.S. PATENT DOCUMENTS 9,466,690 B1 * 10/2016 Balakrishnan .... H01L 29/66522
9,478,661 B1   10/2016 Xie et al.
(Continued)

FOREIGN PATENT DOCUMENTS

WO        2019139572 A1    7/2019

OTHER PUBLICATIONS

International Preliminary Report on Patentability dated Jul. 14, 2020 for International Patent Application PCT/US2018/013138, 6 pages.
(Continued)

*Primary Examiner* — Dao H Nguyen
(74) *Attorney, Agent, or Firm* — Schwabe, Williamson & Wyatt P.C.

(57) ABSTRACT

An integrated circuit structure includes a first portion of a bottom semiconductor fin extending horizontally in a length direction and vertically in a height direction, a second portion of the bottom semiconductor fin extending horizontally in the length direction and vertically in the height direction, a top semiconductor fin extending horizontally in the length direction and vertically in the height direction, and an insulator region extending horizontally in the length direction to electrically insulate the first portion of the bottom semiconductor fin from the second portion of the bottom semiconductor fin. The insulator region further extends vertically in the height direction in vertical alignment with the top semiconductor fin. The insulator region includes at least one of an insulator material and an airgap. In an embodiment, the top semiconductor fin is associated
(Continued)

with a transistor, and the insulator region is in vertical alignment with a gate electrode of the transistor.

20 Claims, 22 Drawing Sheets

(51) Int. Cl.
  *H01L 29/417* (2006.01)
  *H01L 29/78* (2006.01)
(58) Field of Classification Search
  CPC ....... H01L 29/66545; H01L 21/823821; H01L 21/8258; H01L 21/8221
  USPC ....... 257/365, 369, 401, 329, 190, 192, 288, 257/E27.026, E27.062, E27.064, E27.103, 257/E29.137, E29.242, E29.255, E29.309, 257/E21.09, E21.19, E21.347, E21.409, 257/E21.421, E21.614; 438/283, 153, 438/154, 157, 425
  See application file for complete search history.

(56) References Cited

U.S. PATENT DOCUMENTS

| | | | |
|---|---|---|---|
| 10,297,513 B1* | 5/2019 | Yamashita | H01L 29/6656 |
| 2013/0005103 A1 | 1/2013 | Liu et al. | |
| 2015/0021691 A1 | 1/2015 | Akarvarder et al. | |
| 2015/0064855 A1 | 3/2015 | Cheng et al. | |
| 2016/0005852 A1* | 1/2016 | Kim | H01L 27/1211 |
| | | | 257/401 |
| 2017/0005002 A1 | 1/2017 | Ching et al. | |
| 2018/0315833 A1* | 11/2018 | Duriez | B82Y 10/00 |
| 2020/0343241 A1* | 10/2020 | Wu | H01L 27/0688 |

OTHER PUBLICATIONS

International Search Report and Written Opinion received for PCT Application No. PCT/US2018/013138. dated Oct. 10, 2018. 10 pages.

* cited by examiner

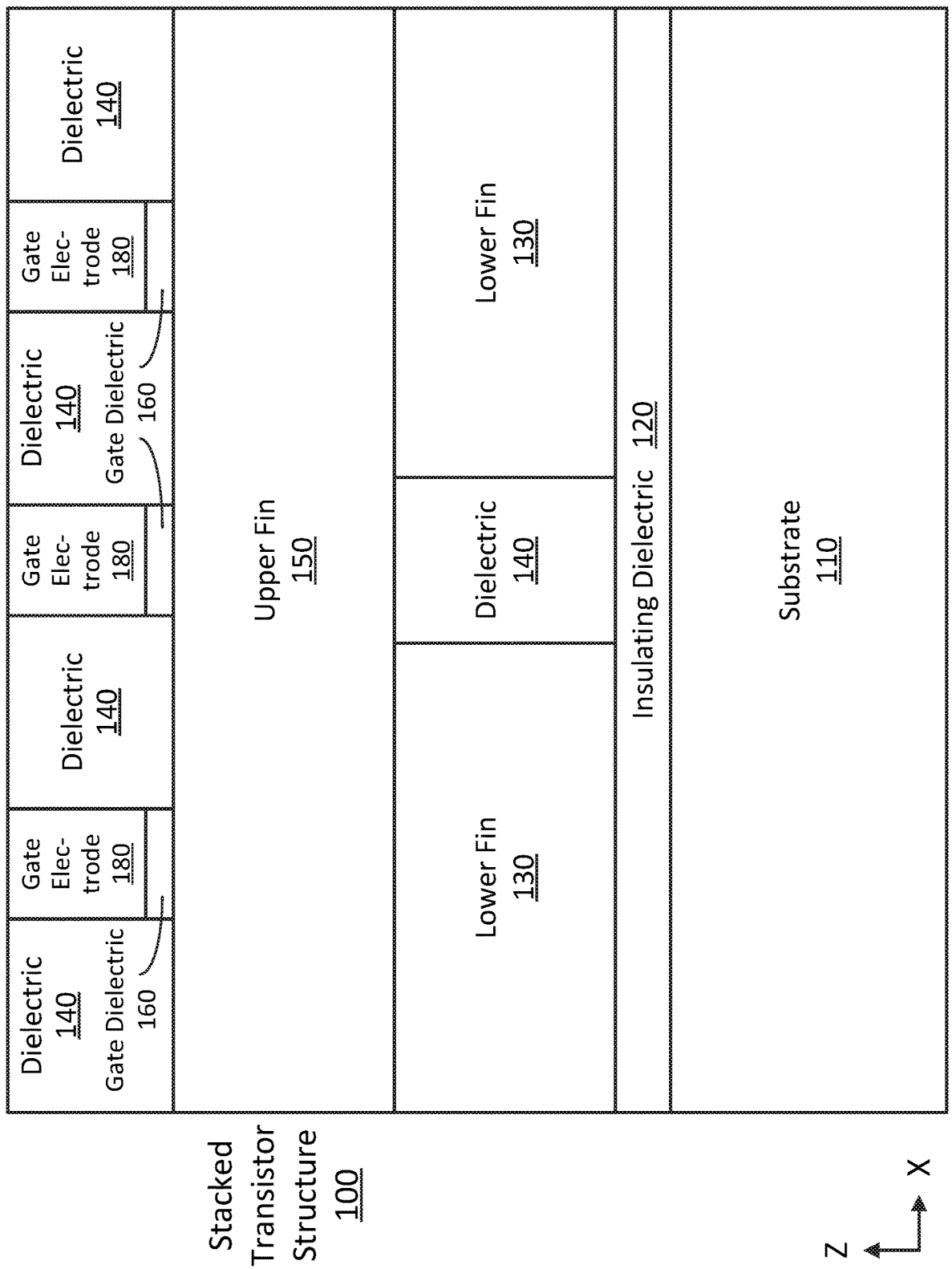

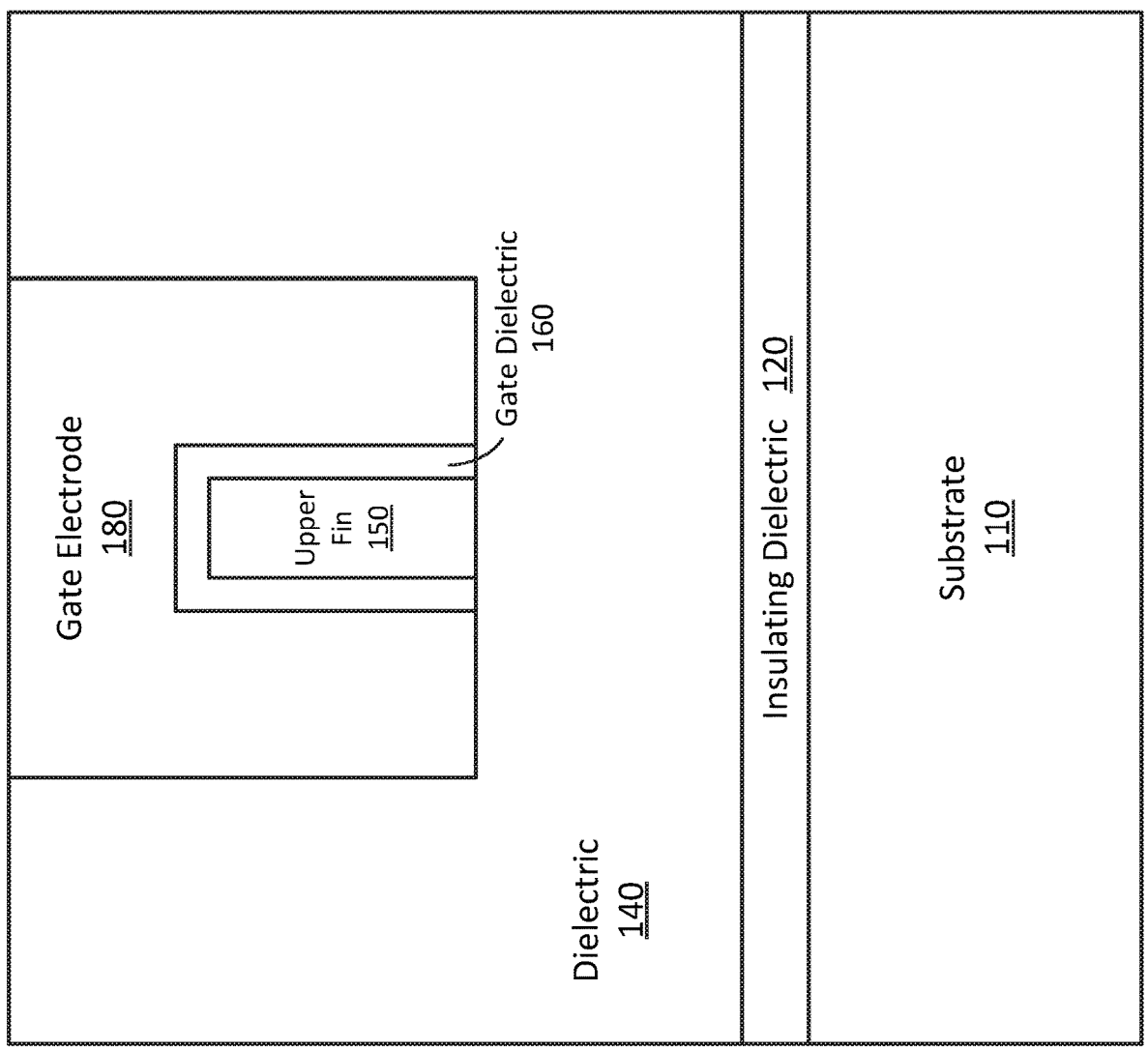

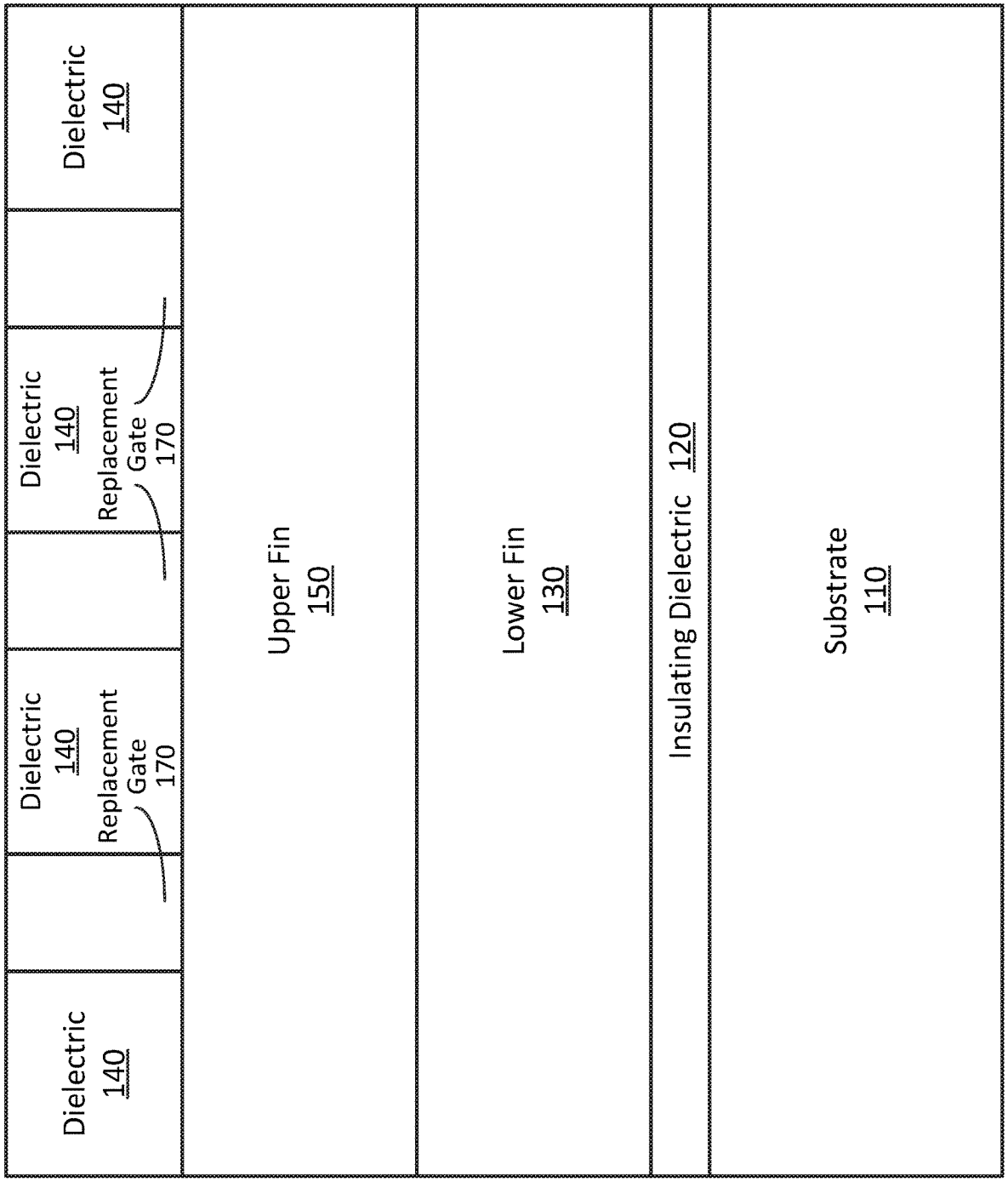

Method of Forming Integrated Circuit Structure 500

```
Start
  │
  ▼
Form semiconductor fin including lower portion and upper portion
510
  │
  ▼
Form replacement gate on lower and upper portions of semiconductor fin
520
  │
  ▼
Form dielectric layer on semiconductor fin and replacement gate, and expose top of replacement gate
530
  │
  ▼
Evacuate exposed replacement gate from dielectric layer to expose lower and upper portions of semiconductor fin through evacuated replacement gate
540
  │
  ▼
Etch exposed lower and upper portions of semiconductor fin with etchant that selectively etches semiconductor material of lower portion of semiconductor fin and does not etch semiconductor material of upper portion, to remove exposed lower portion of semiconductor fin while leaving exposed upper portion intact
550
  │
  ▼
End
```

FIG. 5

BOTTOM FIN TRIM ISOLATION ALIGNED WITH TOP GATE FOR STACKED DEVICE ARCHITECTURES

CROSS-REFERENCE TO RELATED APPLICATIONS

This patent application is a U.S. National Phase Application under 35 U.S.C. § 371 of International Application No. PCT/US2018/013138, filed on Jan. 10, 2018, the entire contents of which is hereby incorporated by reference herein.

BACKGROUND

Semiconductor fin structures are being used as alternatives to other approaches such as thin-film transistors (TFTs) for scaling semiconductor devices such as transistors into denser packages. There are a number of non-trivial performance issues associated with semiconductor fin structures.

BRIEF DESCRIPTION OF THE DRAWINGS

FIGS. 1A-1B are cross-sectional views of an example stacked transistor structure, according to an embodiment of the present disclosure.

FIGS. 2A-2H and 2J-2L are cross-sectional views of an example method of fabricating the stacked transistor structure of FIGS. 1A-1B, according to an embodiment of the present disclosure.

FIGS. 5-6 are flow diagrams of example methods of fabricating integrated circuit structures, according to embodiments of the present disclosure.

Figure 2B:
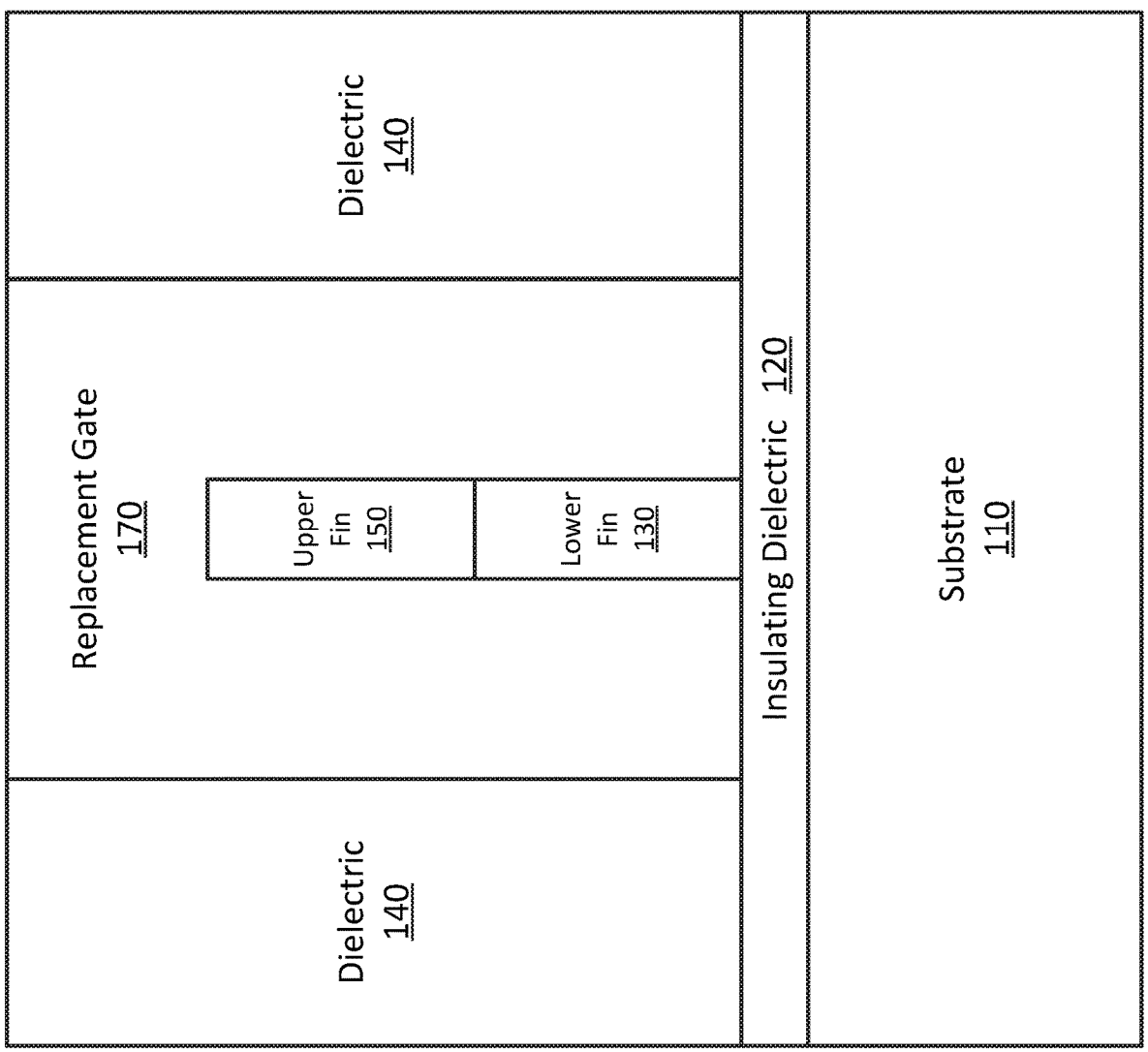

These and other features of the present embodiments will be understood better by reading the following detailed description, taken together with the figures herein described. In the drawings, each identical or nearly identical component that is illustrated in various figures may be represented by a like numeral. For purposes of clarity, not every component may be labeled in every drawing. Furthermore, as will be appreciated, the figures are not necessarily drawn to scale or intended to limit the described embodiments to the specific configurations shown. For instance, while some figures generally indicate straight lines, right angles, and smooth surfaces, an actual implementation of the disclosed techniques may have less than perfect straight lines and right angles, and some features may have surface topography or otherwise be non-smooth, given real-world limitations of fabrication processes. In short, the figures are provided merely to show example structures.

DETAILED DESCRIPTION

A stacked transistor structure is disclosed, the structure having one or more top transistors on a top semiconductor fin and one or more bottom transistors on a bottom semiconductor fin that is vertically aligned with the top semiconductor fin, according to an embodiment. The structure further includes a bottom fin trim isolation (FTI) aligned with a top transistor gate structure. The FTI electrically isolates two regions of the bottom fin. The FTI may be, for instance, an airgap, or deposited insulator material, or a portion of the bottom fin that has been converted to insulator material. In various embodiments, this FTI to a bottom fin is accomplished without cutting the top fin or otherwise electrically isolating different regions of the top fin. These FTI structures are useful, for instance, for complementary metal-oxide semiconductor (CMOS) routing. For example, n-type MOS (NMOS) transistors may be fabricated in the top fin while their corresponding p-type MOS (PMOS) transistors of a CMOS transistor structure are fabricated in the bottom fin. According to some embodiments of the present disclosure, the PMOS transistors can be electrically separated without causing a corresponding electrical separation of the NMOS transistors. Numerous other stacked device configurations will be apparent.

General Overview

Stacking transistors and other devices can increase the density (or area density) of such devices on an integrated circuit. However, as noted above, there are a number of non-trivial performance issues associated with such stacked device structures. For instance, with stacked semiconductor fin structures having two device layers, trying to electrically isolate two regions of the bottom devices usually entails electrically isolating the corresponding regions of the top devices. However, it is not always possible or practical to design cells of stacked transistor structures such that electrical isolations (e.g., fin cuts) in the top device layer coincide with electrical isolations in the bottom device layer.

Accordingly, techniques are provided herein for cutting or isolating just the bottom semiconductor fin of a stacked semiconductor fin structure, without cutting or isolating the top semiconductor fin. Here, the fin structure is used to produce one layer of devices in the bottom portion of the fin structure and a second layer of devices in the top portion of the fin structure. Note that the top and bottom portions of the fin structure are aligned with one another to provide an overall fin structure, but may be implemented with compositionally different semiconductor materials to effectively provide top and bottom semiconductor fins. Note also that the use of compositionally different materials may provide an etch selectivity to facilitate removal of the bottom fin material without removing the top fin material, as will be further explained below.

In some embodiments, the isolation is through an evacuated region formed by removal of a sacrificial/replacement/dummy gate. In some such embodiments, a selective wet etch is used to remove the semiconductor material of the bottom fin and not the semiconductor material of the top fin. For example, an etchant that removes silicon but not silicon germanium can be used to selectively etch a silicon bottom fin while leaving a silicon germanium top fin. In other embodiments, the FTI is accomplished through deposition and use of an oxidation catalyst such as aluminum oxide (e.g., $Al_2O_3$) deposited upon a suitable semiconductor such as silicon or silicon germanium, followed by thermal processing (e.g., annealing) to form an insulating oxide of the semiconductor. Various embodiments of the present disclosure allow for CMOS routing for self-aligned vertically stacked CMOS transistors in a stacked fin transistor architecture (e.g., stacked fin field-effect transistor, or stacked FinFET) by enabling fin trim isolation (FTI) on just the bottom device layer (and without cutting the fin containing the top device layer).

It should be noted that, throughout, terms such as "top" and "upper" as well as "bottom" and "lower" are used primarily for consistency and ease of description with the supplied drawings. However, the actual orientation during some of the fabrication or in some of the final products may differ between embodiments without departing from the scope of the present disclosure.

In an example embodiment of the present disclosure, an integrated circuit (IC) structure is provided. The IC structure includes a first portion of a bottom semiconductor fin extending horizontally in a length direction and vertically in a height direction, a second portion of the bottom semiconductor fin extending horizontally in the length direction and vertically in the height direction, a top semiconductor fin extending horizontally in the length direction and vertically in the height direction, and an insulating region extending horizontally in the length direction and electrically insulating the first portion of the bottom semiconductor fin from the second portion of the bottom semiconductor fin. The insulating region further extends vertically in the height direction in vertical alignment with the top semiconductor fin. The insulating region includes at least one of an insulator material and an airgap.

In another example embodiment of the present disclosure, a complementary metal oxide semiconductor (CMOS) integrated circuit (IC) is provided. The CMOS IC includes a first transistor, a second transistor, an insulating region in horizontal alignment with and electrically separating the first and second transistors, and a third transistor. The first transistor is associated with a first portion of a bottom semiconductor fin and has one of n-type and p-type first source and drain regions. The second transistor is associated with a second portion of the bottom semiconductor fin that is in horizontal alignment with the first portion of the bottom semiconductor fin, and also has the one of n-type and p-type second source and drain regions. The insulator region includes at least one of an insulator material and an airgap. The third transistor is associated with a top semiconductor fin and has the other of n-type and p-type third source and drain regions. In addition, the third transistor has a gate structure in vertical alignment with the insulating region. The gate structure includes a gate dielectric on the channel region of the third transistor and a gate electrode on the gate dielectric.

Architecture and Methodology

FIGS. 1A-1B are cross-sectional views of an example stacked transistor structure 100, according to an embodiment of the present disclosure. In the stacked transistor structure 100, FIG. 1A is an X-Z view and FIG. 1B is a Y-Z view, where X, Y, and Z represent the length, width, and height dimensions of the underlying semiconductor fins making up the stacked transistors. In more detail, FIG. 1A is a cross-sectional view through upper and lower fins 150 and 130 of the upper and lower transistors, respectively, while FIG. 1B is a cross-sectional view through gate electrode 180 of the upper transistor (or the middle transistor of the upper transistors). The lower fin 130 is electrically separated (or isolated) into two regions by dielectric material 140 while the upper fin 150 is electrically contiguous or unisolated. The dielectric material 140 (or, in some embodiments, an airgap) between the two regions of the lower fin 130 is in vertical alignment with the gate electrode 180 of the upper transistor.

It should be noted that while most of the description herein is directed to stacked transistor structures having two device layers (e.g., an upper device layer and a lower device layer), some other embodiments of the present disclosure are directed to stacked transistor structures of three or more device layers. For example, in some embodiments, there are three or more device layers in a stacked transistor structure, where the FTI is on one or more of the lower fins and not on the topmost fin. It should also be noted that while upper transistors (formed with the upper fin 150) would likely be electrically isolated from the lower transistors (formed on lower fin 130), for ease of illustration, these isolation layers or members (such as can be implemented from portions of the upper fin 150 or lower fin 130 or both) may not be illustrated.

Referring to FIGS. 1A-1B, semiconductor 110, such as silicon (Si), silicon germanium (SiGe), or a Group III-V semiconductor such as gallium arsenide (GaAs) is formed into vertical fins, such as lower fin 130 and upper fin 150 (that together can constitute one of the original semiconductor fins). At some point in the fabrication, one or both of the lower and upper fins 130 or 150 or their original structures may be replaced with a different fin structure using the original fin shape as a guide or template for forming the replacement fin or fins. For example, in some embodiments, the upper fin 150 includes replacement semiconductor fin material different than the semiconductor fin material of the lower fin 130. The substrate 110 is covered with a layer of insulating dielectric 120 (e.g., an oxide, nitride, or oxynitride of the semiconductor 110, or other electrically insulating material). The insulating dielectric 120 helps electrically isolate the devices from the substrate 110.

By way of example, the semiconductor fins can be formed through photolithography, epitaxial growth (such as aspect ratio trapping, or ART), or similar techniques, with corresponding trenches between (and defined by) adjacent fins. The fins, for example, can be made of the same semiconductor material as semiconductor substrate 110, and be of a uniform or consistent width or shape (e.g., rectangular, trapezoidal, to name a few). It is desired to use the fins to form a stacked transistor structure, with the lower portions 130 of the fins having fin trim isolation (FTI) with respect to the upper portions 150 of the fins. The fin material can be replaced or grown as different materials, such as one or more nanowires stacked vertically in the original fin structure. Different materials can be used for the upper fin 150 versus the lower fin 130. One or both of the upper and lower fins 150 and 130 may be the same semiconductor material as the semiconductor substrate 110. In some embodiments, a common semiconductor fin is used for the upper and lower fins 150 and 130. In some embodiments, a common semiconductor fin is used to form the upper and lower fins 150 and 130, the semiconductor fin possibly serving as a template for replacement fin material (e.g., epitaxially grown replacement fin material) to form one or both of the upper and lower fins 150 and 130.

For example, silicon (Si) can be used for one of the upper and lower fins 150 and 130, and silicon germanium (SiGe) for the other. In some other embodiments, Si and gallium arsenide (GaAs) can make up the upper and lower fins 150 and 130 (in some order). In one or more embodiments, Si and a Group III-V semiconductor (e.g., a compound including a Group III element such as boron, aluminum, gallium, and indium together with a Group V element such as nitrogen, phosphorus, arsenic, antimony, and bismuth) make up the upper and lower fins 150 and 130 (in some order). In some embodiments, Si and Ge make up the upper and lower fins 150 and 130 (in some order). The substrate 110 can be one of the materials making up the upper and lower fins 150 and 130, or another material (such as another semiconductor material).

The upper fin 150 is covered with a gate dielectric 160, such as a high-κ dielectric like hafnium dioxide (e.g., $HfO_2$). The gate dielectric 160 is covered with a gate electrode 180, such as one or more of a metal, conductive oxide, heavily doped semiconductor, and the like. The gate electrode 180 controls the upper transistor by applying a gate voltage to a semiconductive channel region (e.g., a portion of the upper fin that coincides with the gate structure) of the upper transistor. The channel region electrically connects source and drain regions (e.g., highly doped semiconductor regions adjacent to and on opposites sides of the channel region) of the upper transistor in response to the applied gate electrode voltage. The source and drain can be, for example, heavily doped regions of the upper fin 150. For instance, n-type source and drain regions can be semiconductor material heavily doped with n-type dopant, while p-type source and drain regions can be semiconductor material heavily doped with p-type dopant. In some embodiments, the source and drain regions are replacement semiconductor material, such as epitaxially formed source and drain regions with in situ doping.

In a similar fashion, transistors can be formed with the lower fin 130, and further transistors can be formed with the upper fin 150. For example, the two regions of the lower fin 130 are separated by the dielectric material 140 (or airgap) that electrically isolates the two regions and is vertically aligned with the gate structure (e.g., gate dielectric 160 and gate electrode 180) of the above-described upper transistor. As such, each region of the lower fin 130 can be associated with one or more transistors vertically aligned with a corresponding one or more transistors associated with the upper fin 150, with the transistors in one region of the lower fin 130 being electrically isolated from the transistors in the other region of the lower fin 130, and the transistors of the upper fin 150 being electrically unisolated from one another.

The upper transistors of the stacked transistor structure 100 are usually electrically isolated from (or not in direct contact with) the lower transistors. By way of example, insulating dielectric layers such as silicon dioxide ($SiO_2$) can separate lower gate electrodes from upper gate electrodes (e.g., when it is desired to drive the corresponding upper and lower transistors with different signals. In addition, isolation layers between the lower and upper fins 130 and 150 can electrically separate the lower and upper transistors (such as the source and drain regions of the lower transistors from the source and drain regions of the upper transistors). The isolation layers can separate the source and drain regions associated with the lower fin 130 from those associated with the upper fin 150. These isolation layers can correspond to the semiconductor fin (e.g., formed originally from the same tall semiconductor fin), such as between and vertically aligned with the lower fin 130 and upper fin 150.

For example, the isolation layers can be doped semiconductor. For instance, if the upper transistors are NMOS devices, then an isolation layer adjacent to the upper fin 150 can be p-doped semiconductor, and if the upper transistors are PMOS devices, then this isolation layer can be n-doped semiconductor. Likewise, if the lower transistors are NMOS devices, then an isolation layer adjacent to the lower fin 130 can be p-doped semiconductor, and if the lower transistors are PMOS devices, then this isolation layer can be n-doped semiconductor. In some embodiments, the isolation layers are formed through oxidation or removal of a portion of the fin between the lower and upper fins 130 and 150. In some embodiments, the isolation layers are formed through fixed charge layers adjacent to the fin (such as fixed charge layers adjacent to the isolation layers). Remaining spaces can be filled with further insulating dielectric 140 such as $SiO_2$.

FIGS. 2A-2H and 2J-2L are cross-sectional views of an example method of fabricating the stacked transistor structure 100 of FIGS. 1A-1B, according to an embodiment of the present disclosure. Most of the illustrations are in pairs, one drawing showing the X—Z cross-sectional view (through the fin) and another drawing showing the corresponding Y—Z cross-sectional view (through the gate electrode). The method of FIGS. 2A-2H and 2J-2L highlights the formation of the FTI in the lower fin 130 (such as with a dielectric material 140 or airgap) of the stacked transistor structure 100.

For instance, in FIGS. 2A-2B, processing begins with the semiconductor substrate 110 having been formed with a semiconductor fin (including lower fin 130 and upper fin 150) on top and separated by the layer of insulating dielectric 120. Any replacement fin processing is also performed (e.g., replacing original fin material with new material or new structure or both). Sacrificial (or replacement or dummy) gate structures 170 (e.g., polysilicon or similar material formed in the shape of a gate structure at locations corresponding to gate structures) are formed (e.g., using semiconductor fabrication techniques such as deposition, lithography, and etching) on the upper and lower fins 150 and 130, and remaining space filled with insulating dielectric 140 such as silicon dioxide ($SiO_2$). The replacement gate structures 170 can be formed around the entire height of the fin (encompassing the upper and lower fins 150 and 130). The replacement gate structures 170 can facilitate the fabrication of real gate structures (e.g., high-κ gate dielectric and metal gate electrode) at appropriate places of the upper and lower fins 150 and 130 (e.g., corresponding to upper and lower transistors controlled by the gate structures).

Figure 2C:
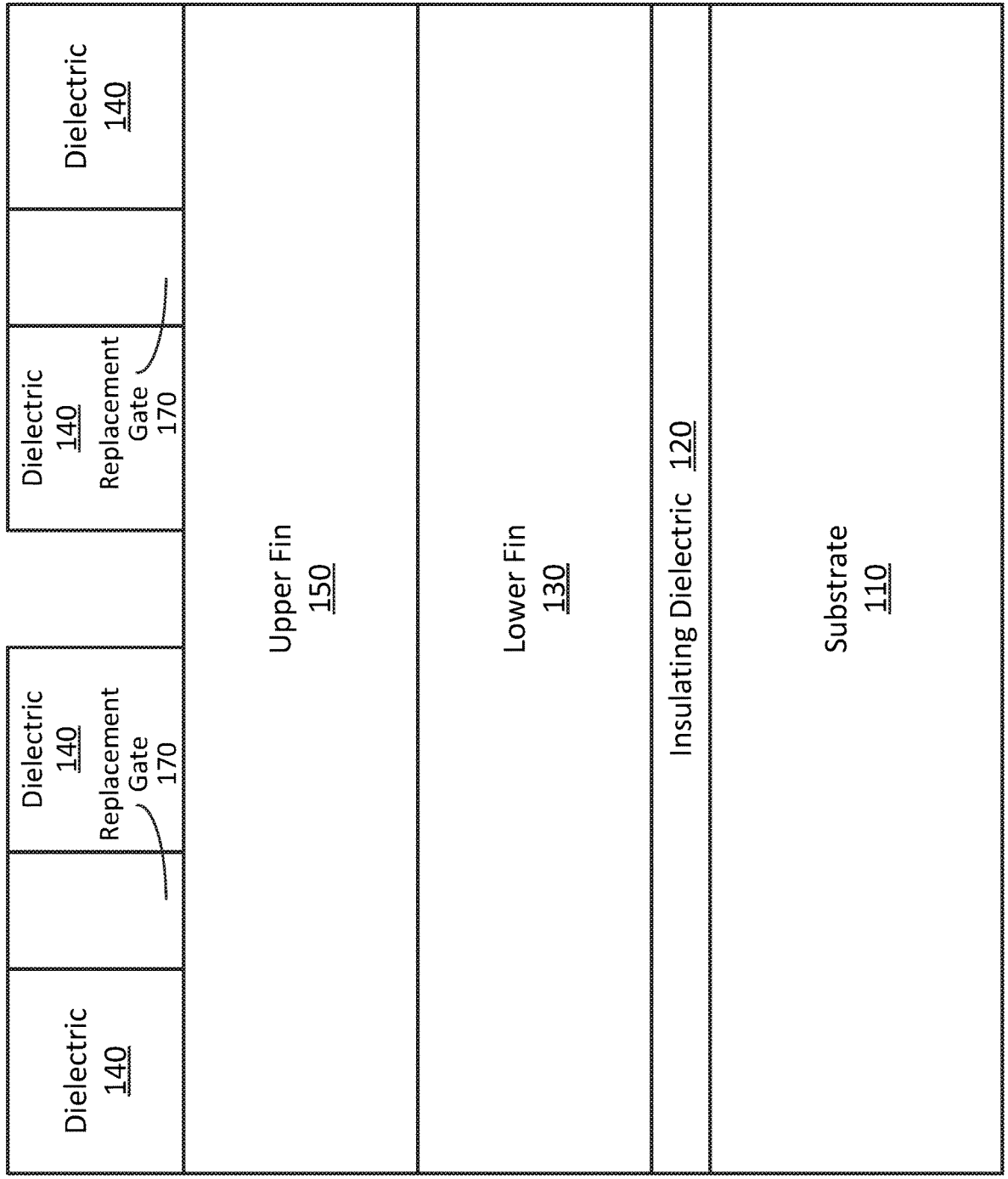
Figure 2D:
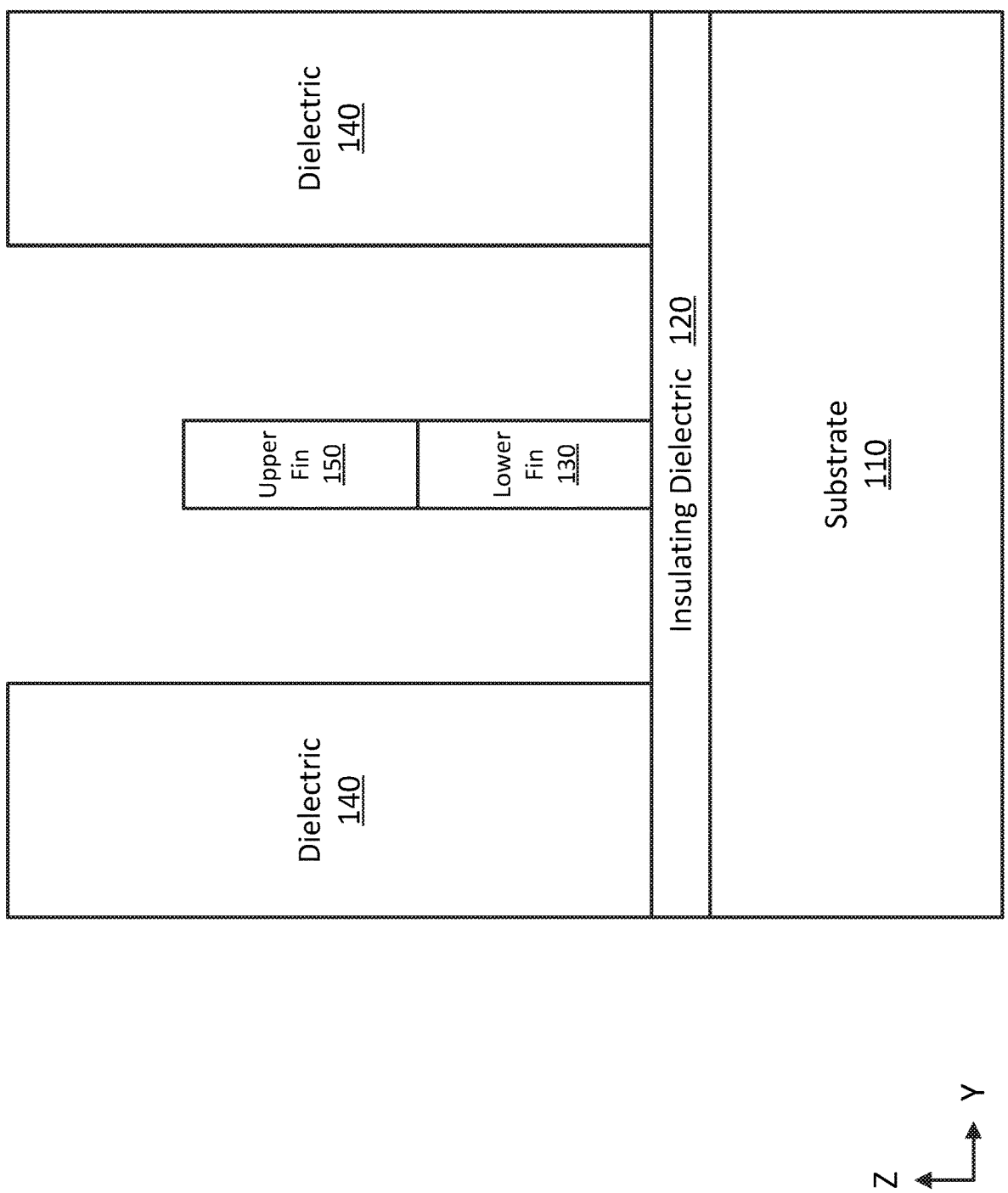

In FIGS. 2C-2D, one of the replacement gate structures 170 (the middle one in FIG. 2C) is selectively etched (e.g., using an etchant that removes the replacement or dummy gate material but not other exposed materials such as the dielectric 140, insulating dielectric 120, or the upper or lower fins 150 or 130, or using lithography to isolate the desired replacement gate material to be removed). This creates an evacuated replacement gate (or evacuated dummy gate), such as a cavity exposing the channel region of the fin, on which the gate structure (e.g., gate dielectric and gate electrode) is formed.

Figure 2E:
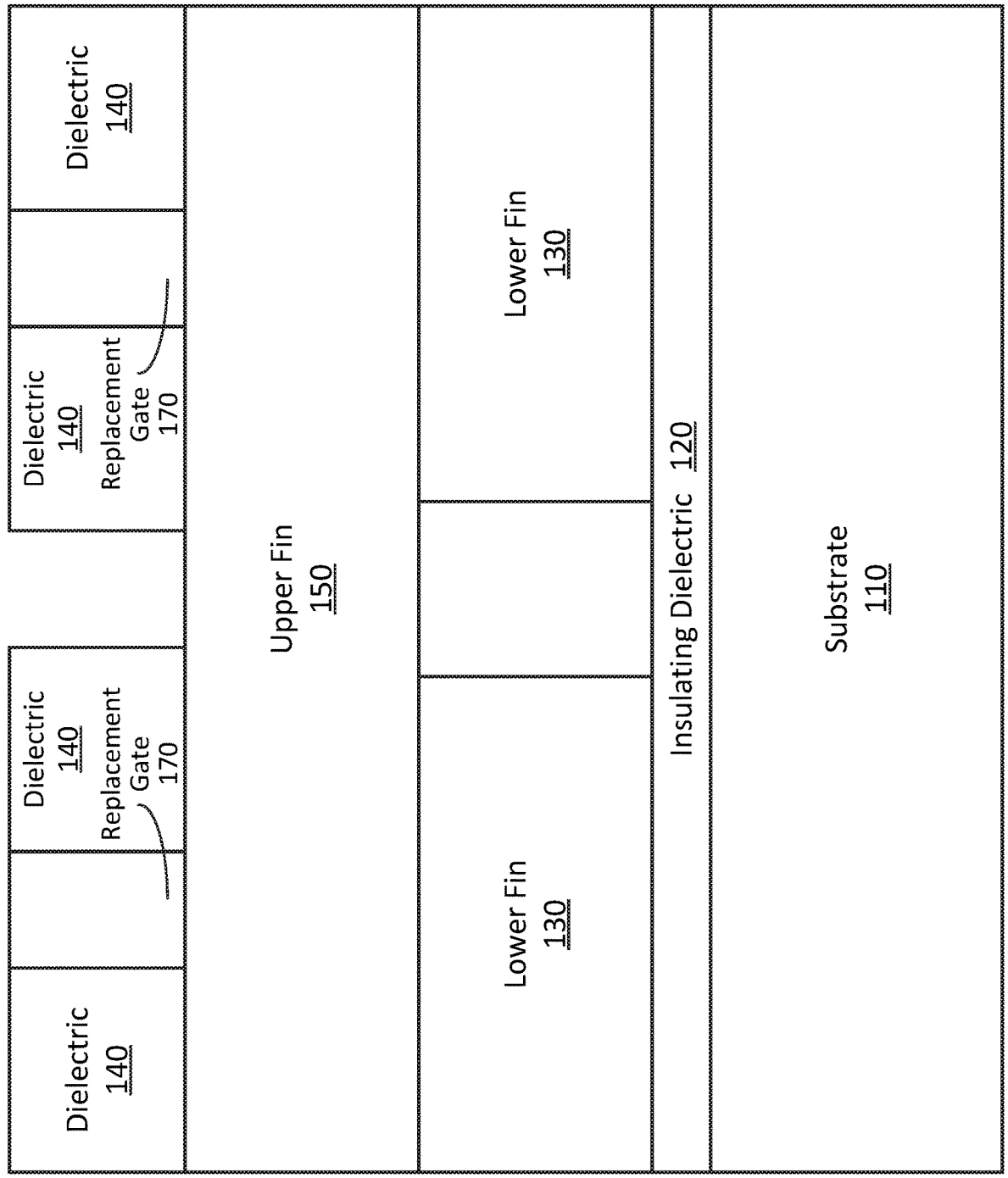
Figure 2F:
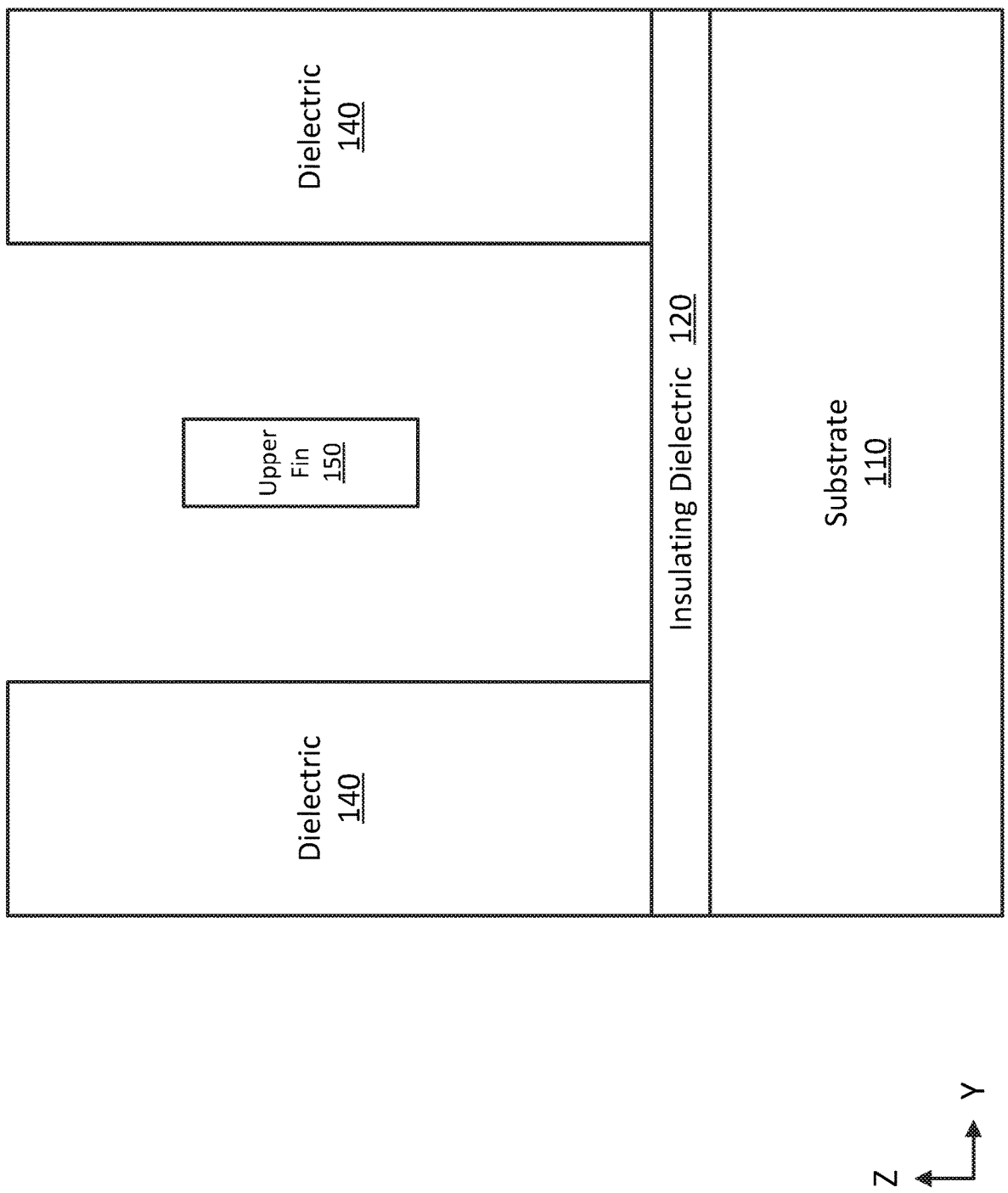

In FIGS. 2E-2F, the exposed portion of the lower fin 130 is removed at the region corresponding to the evacuated gate structure. For example, a selective etch can be performed, one that removes the semiconductor material of the lower fin 130 but not the semiconductor material of the upper fin 150. This creates a void in the lower fin 130 that is wider than the gate structure and in vertical alignment with the channel region (and gate structure) in the upper fin and upper transistor corresponding to the gate structure. This also electrically isolates the two sides (or regions) of the lower fin 130 while leaving the upper fin 150 intact (e.g., corresponding sides or regions electrically unisolated). For example, the lower fin 130 can include SiGe while the upper fin 150 is Si, and a wet etchant that removes SiGe but not Si can be used. In another embodiment, two different SiGe stoichiometry's are used for the semiconductor material of the upper and lower fins 150 and 130, with a selective etchant that removes the lower fin 130 SiGe stoichiometry but not the upper fin 150 SiGe stoichiometry.

Figure 2G:
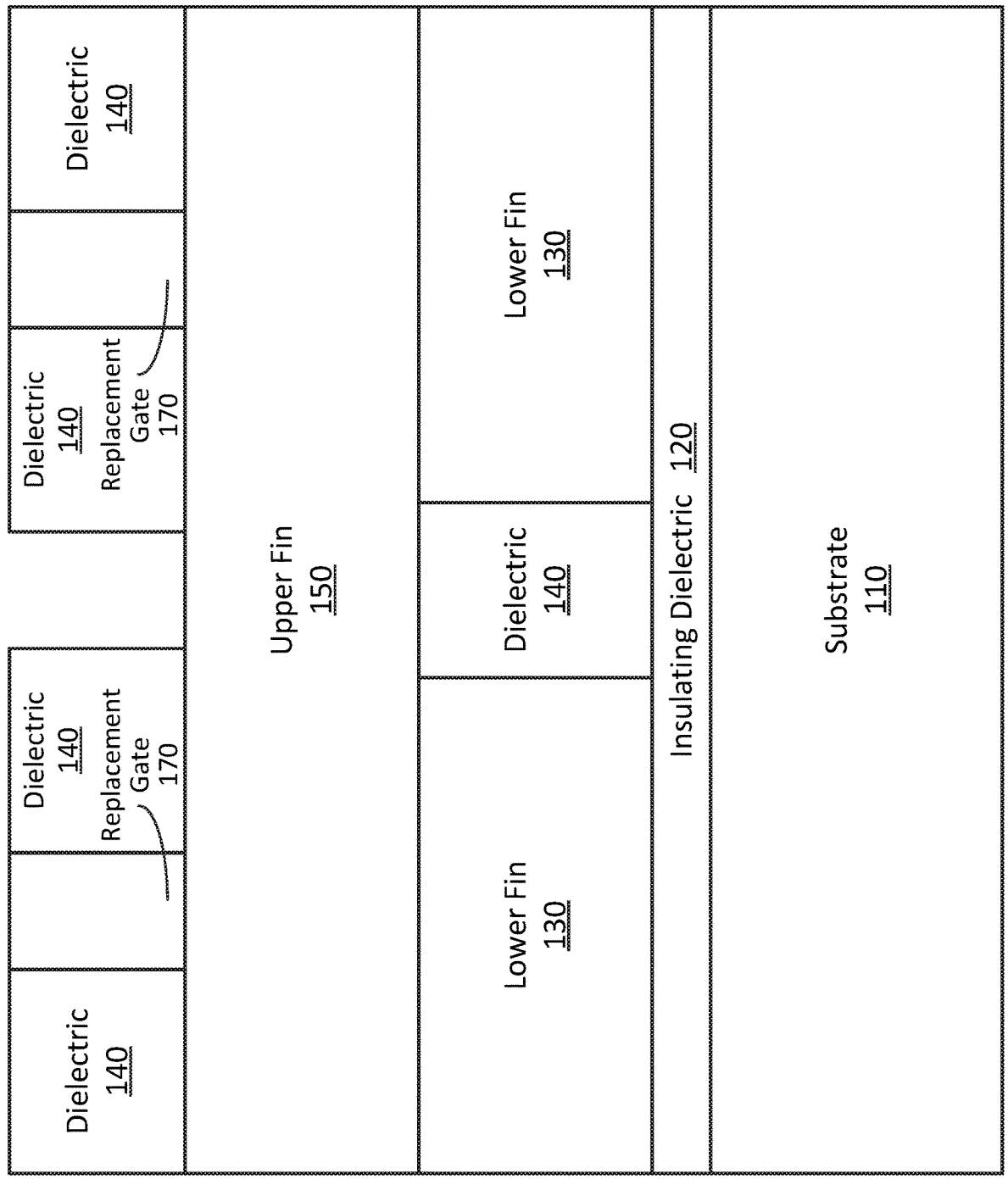
Figure 2H:
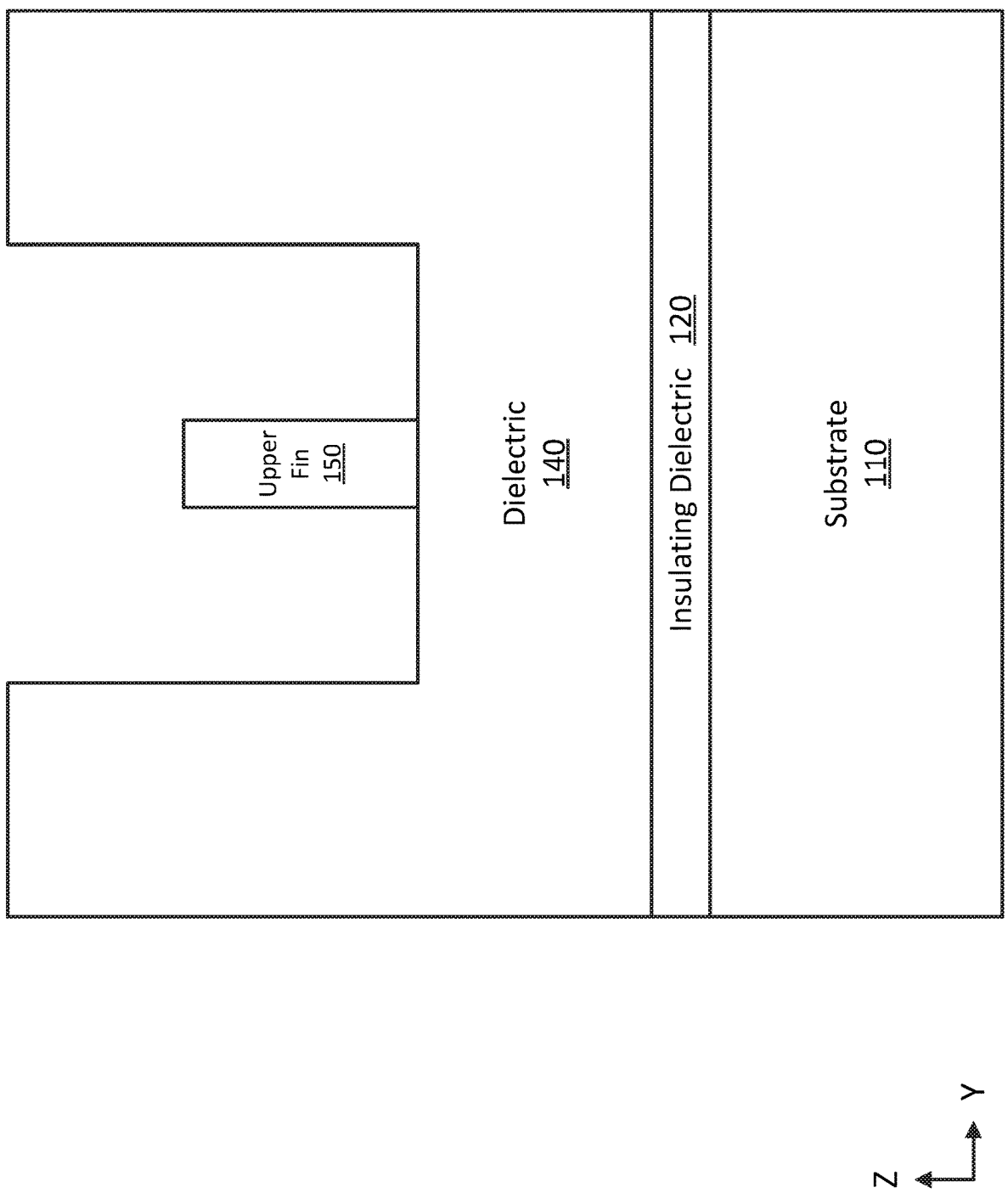
Figure 2J:
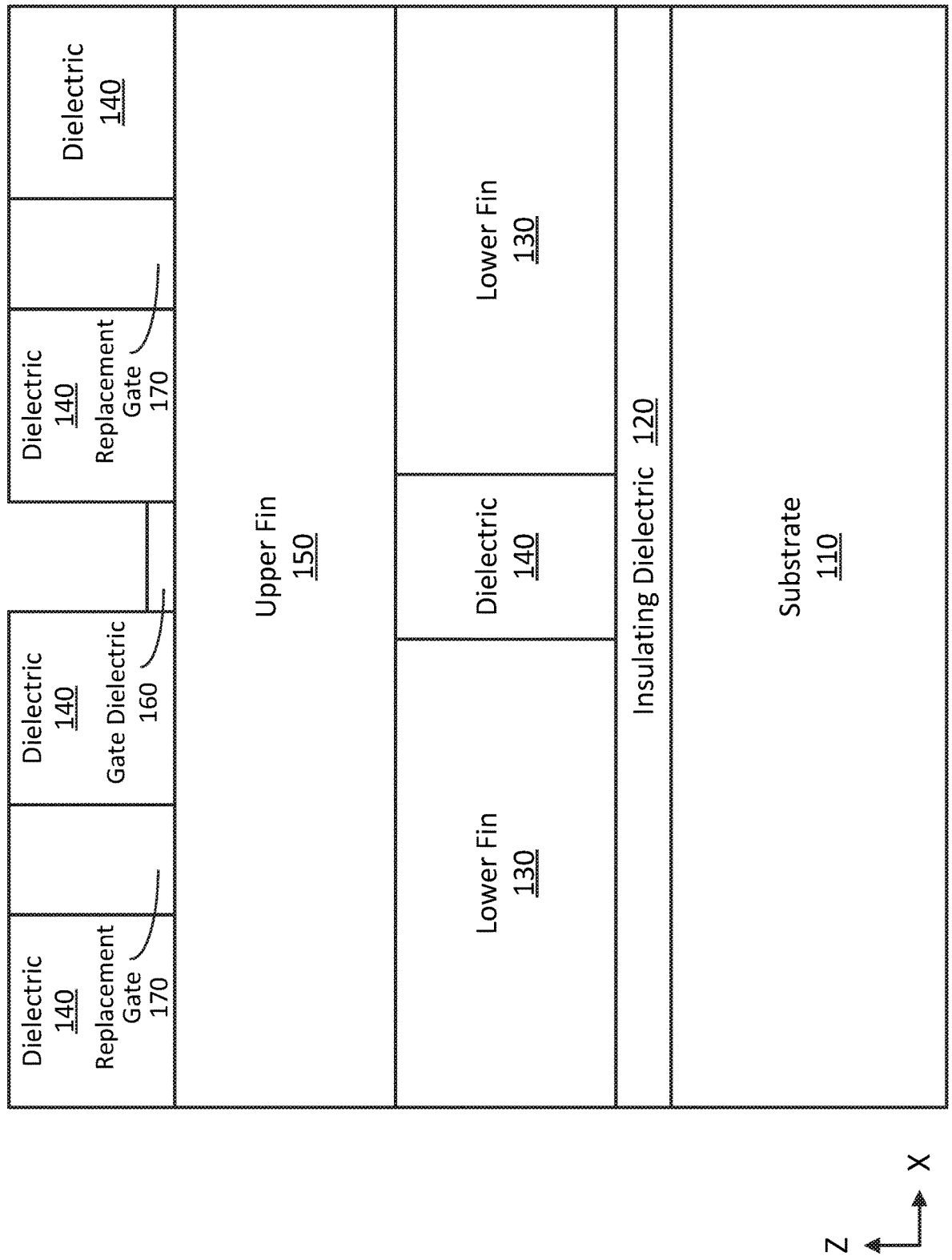
Figure 2K:
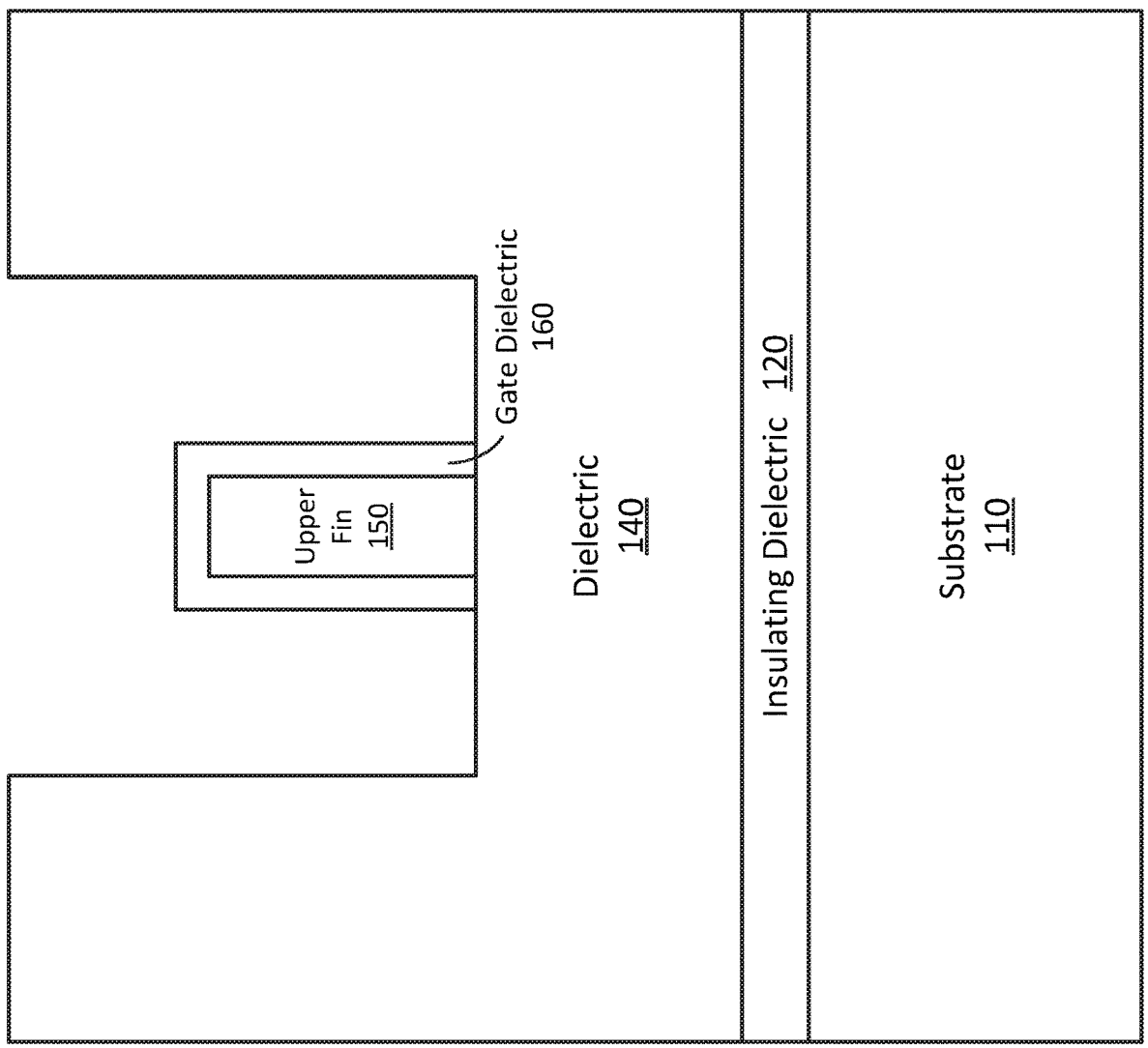
Figure 2L:
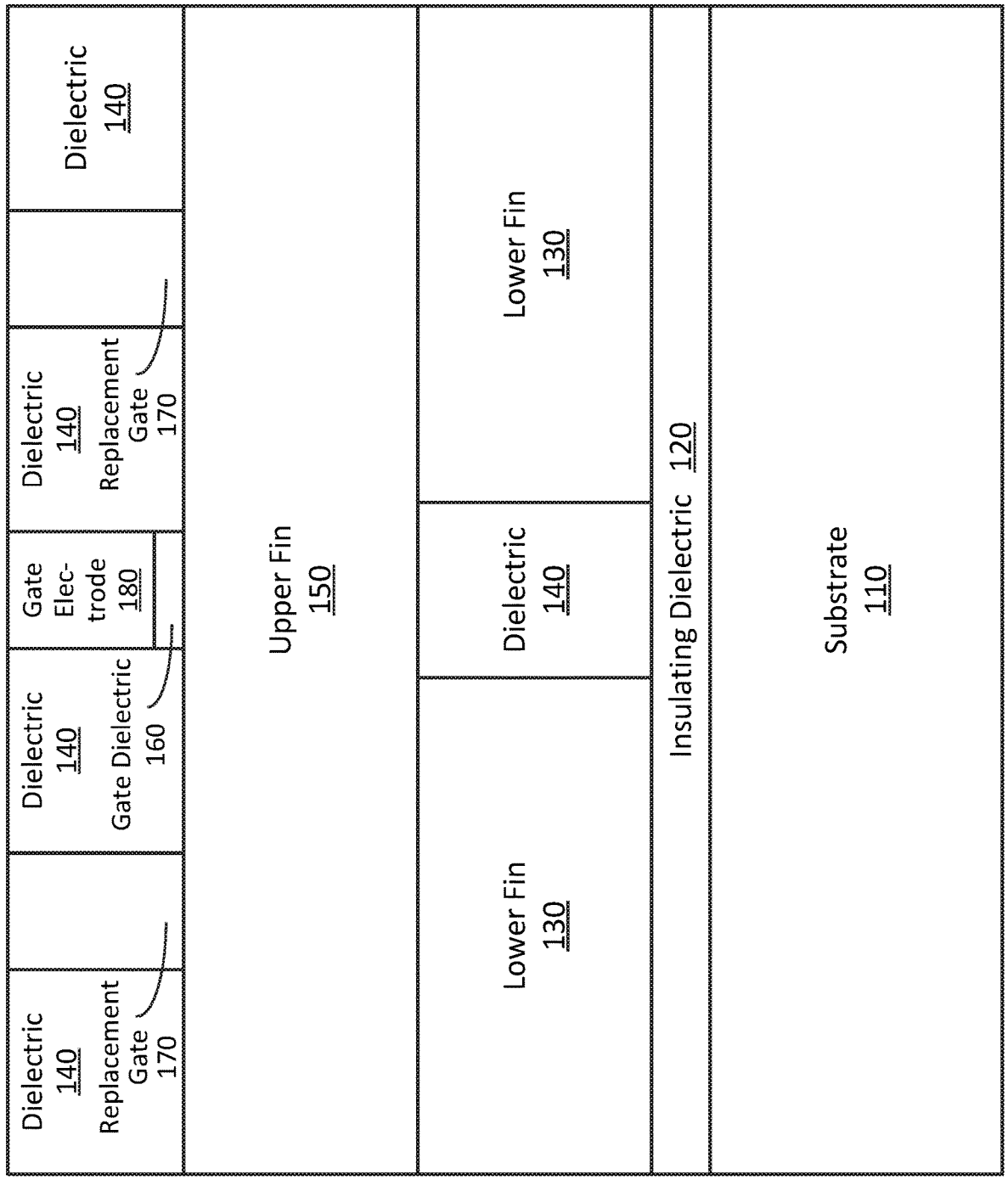

In FIGS. 2G-2H, the evacuated gate structure (including the evacuated portion of the lower fin 130) is partially filled with dielectric material 140 (e.g., $SiO_2$). For purposes of example, the dielectric material filling region 120 may be the same material filling region 140. In some embodiments, an airgap (such as a vacuum, to create a dielectric space) can be formed as part of the fill to electrically isolate the two portions of the lower fin 130. The partial filling can cover the evacuated portion of the lower fin 130 while not filling or covering the corresponding portion of the upper fin 150. In FIGS. 2J-2K, a gate dielectric 160 (e.g., a high-κ dielectric material such as $HfO_2$) is formed on the upper fin 150 as part of the gate structure of the upper transistor. In FIG. 2L, gate electrode 180 (e.g., metal, conductive oxide, doped semiconductor, or the like) is formed in remaining portions of the evacuated gate structure, to complete the gate structure of the upper transistor while maintaining the electrical isolation of the two regions of the lower fin 130. In some embodiments, the forming of the upper gate structure takes place concurrently with forming the gate structures of other upper transistors (such as upper transistors whose corresponding lower fin 130 portions are not being used for FTI).

Figure 3A:
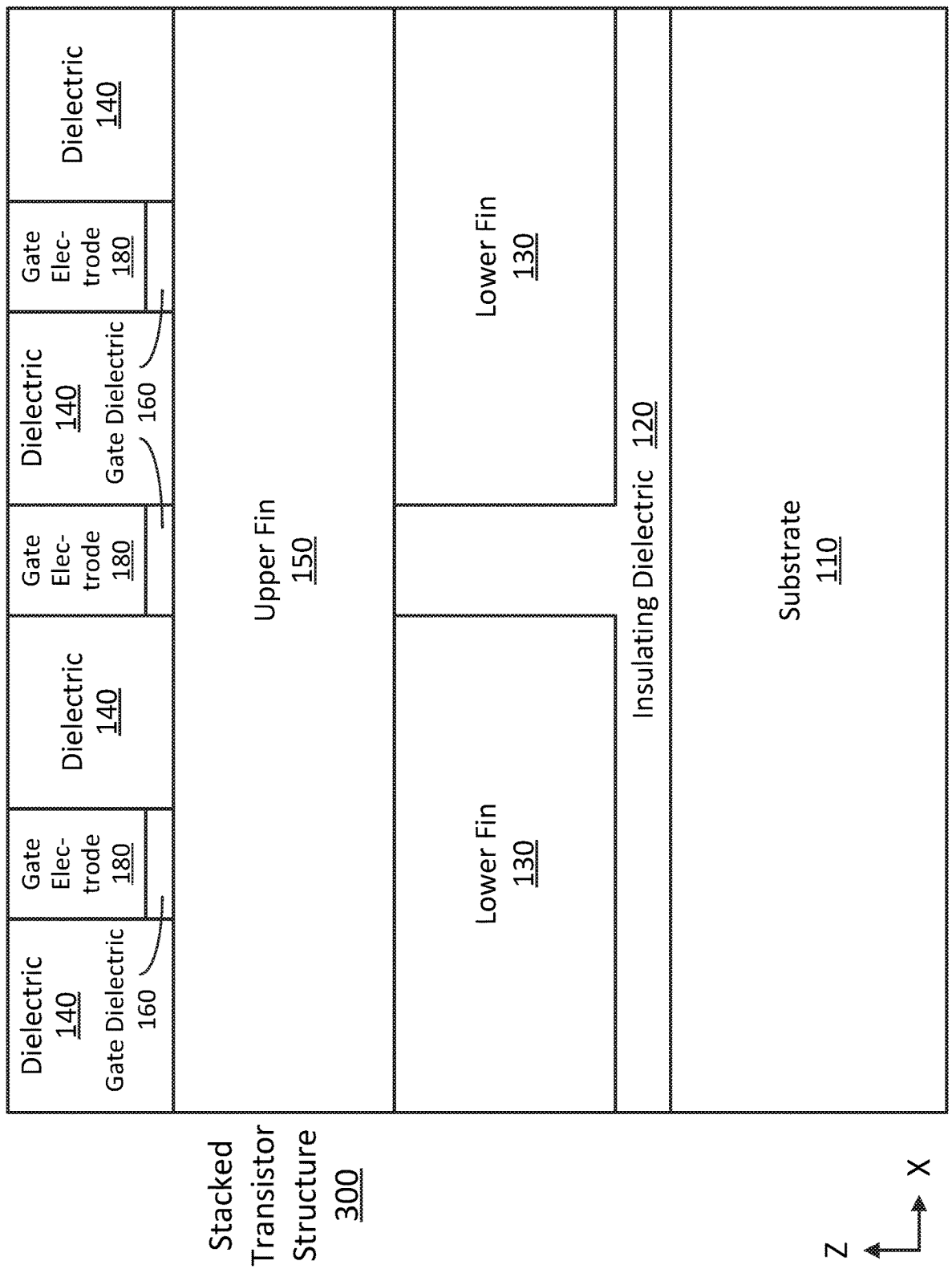
FIGS. 3A-3B are cross-sectional views of an example stacked transistor structure, according to another embodiment of the present disclosure.
Figure 3B:
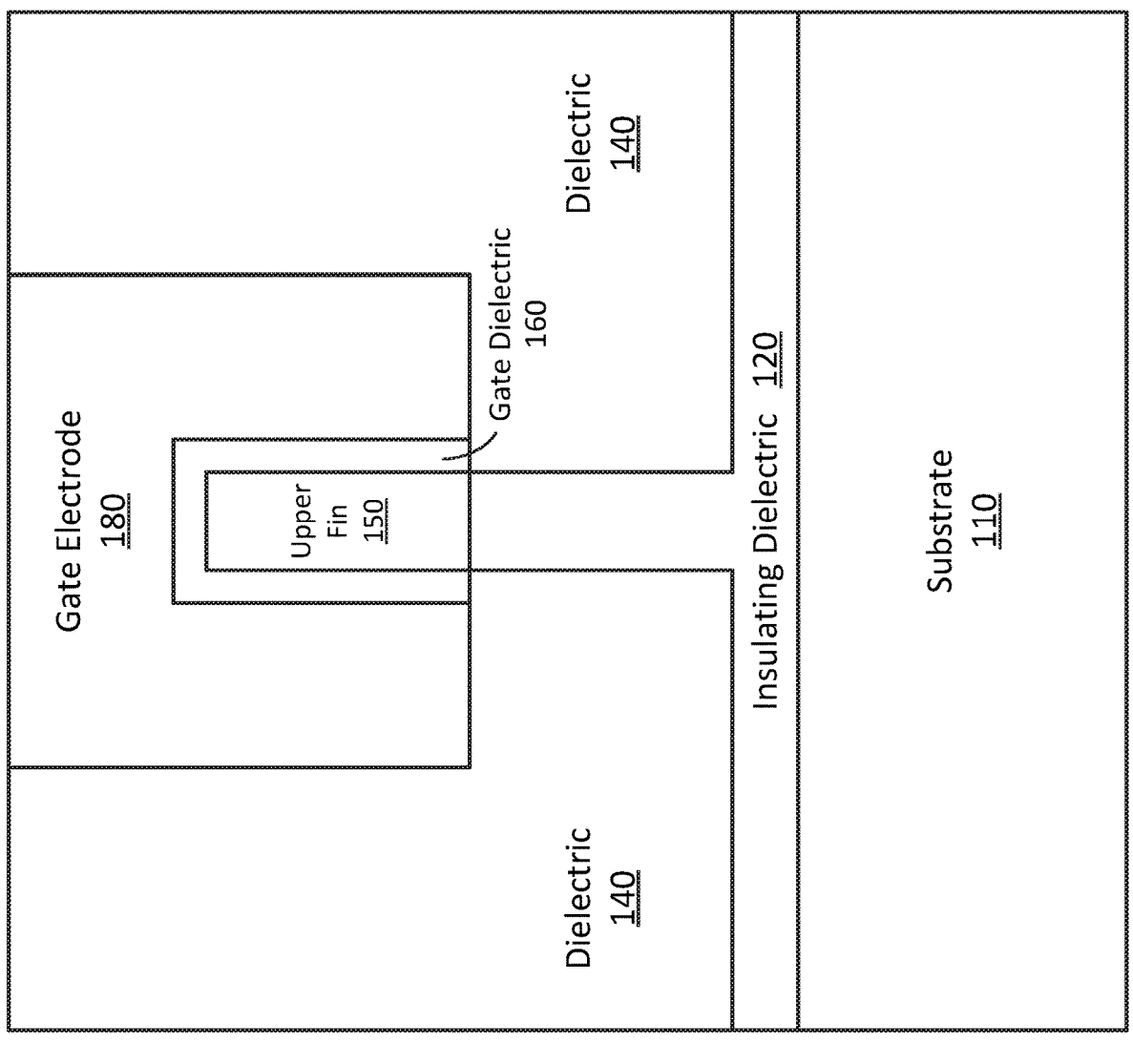

FIGS. 3A-3B are cross-sectional views of an example stacked transistor structure 300, according to another embodiment of the present disclosure. For ease of description, in these and other drawings, the same or substantially similar elements are identified by the same reference numerals, and further description of these elements may not be repeated. In the stacked transistor structure 300, insulating dielectric 120 extends into the region between the lower fins 130, electrically isolating the two lower fins 130 from each other. Further, in contrast to the stacked transistor structure 100 of FIGS. 1A-1B, the width of the extension of the insulating dielectric between the lower fins 130 is comparable to that of the gate electrode 180 vertically aligned with the extension. Further, oxidation catalyst material (e.g., material configured to catalyze the oxidization of the semiconductor material of the lower fins 130) is present in areas of the structure 300 (such as the dielectric material 140) near the extension of the insulating dielectric 120. For example, in some embodiments, aluminum oxide ($Al_2O_3$), a known catalyst of silicon (Si) and silicon germanium (SiGe), can be found in the dielectric material 140 near the extension of the insulating dielectric 120.

It should be noted that, in some embodiments, the insulating material between the lower fins 130 does not have to be the same material as the insulating dielectric 120. Rather, the insulating material can be, for example, an insulating oxide, nitride, or oxynitride of a semiconductor, or other electrically insulating material. In addition, in some embodiments, this insulating material between the lower fins 130 is removed after being formed (e.g., through selective etching), at which point processing can proceed similar to that of FIG. 2F above.

Figure 4A:
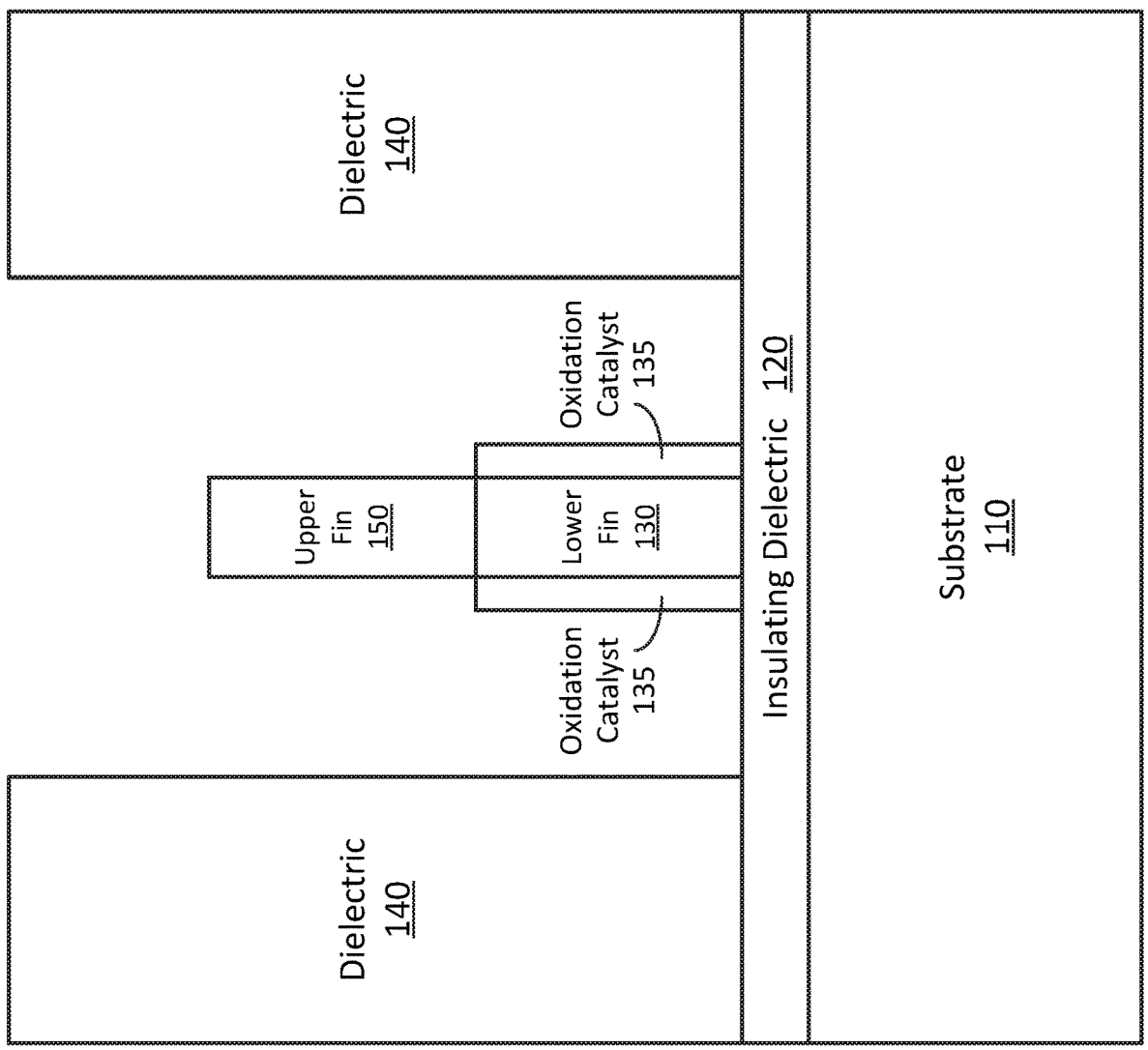
FIGS. 4A-4D are cross-sectional views of an example method of fabricating the stacked transistor structure of FIGS. 3A-3B, according to an embodiment of the present disclosure.

FIGS. 4A-4D are cross-sectional views of an example method of fabricating the stacked transistor structure 300 of FIGS. 3A-3B, according to an embodiment of the present disclosure. In FIG. 4A, similar operations leading to the embodiment of FIG. 2D are performed, only this time followed by a selective coating (such as a selective deposition) of an oxidation catalyst 135 on the exposed lower fin 130. The oxidation catalyst is capable of catalyzing an oxidation of the semiconductor material of the lower fin 130. For example, the oxidation catalyst 135 can catalyze a thermal treatment (such as annealing) of the coated portions of the lower fin 130 to convert those portions to nonconductive oxide, nitride, oxynitride, or other insulating material from the semiconductor material of the lower fin 130.

In some embodiments, the coating of the oxidation catalyst 135 is a two-stage process. In the first stage, the oxidation catalyst 135 is coated on the exposed portions of both the upper and lower fins 150 and 130. In the second stage, the oxidation catalyst 135 coating is selectively removed from the upper fin 150, leaving the exposed (or previously exposed and recently coated) portions of the lower fin 130 still coated by the oxidation catalyst 135. These operations can be performed, for example, using photolithography or similar techniques.

Figure 4B:
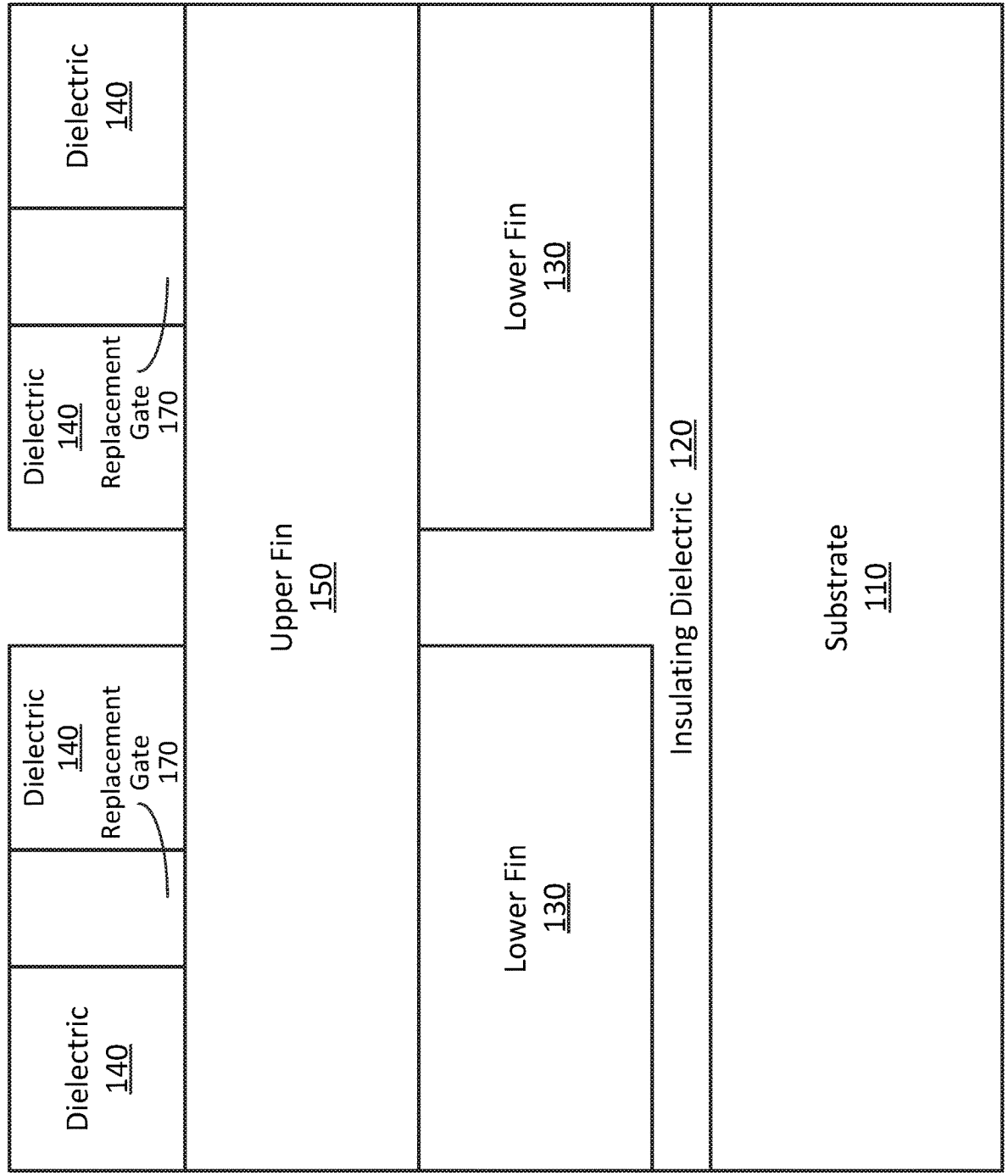
Figure 4C:
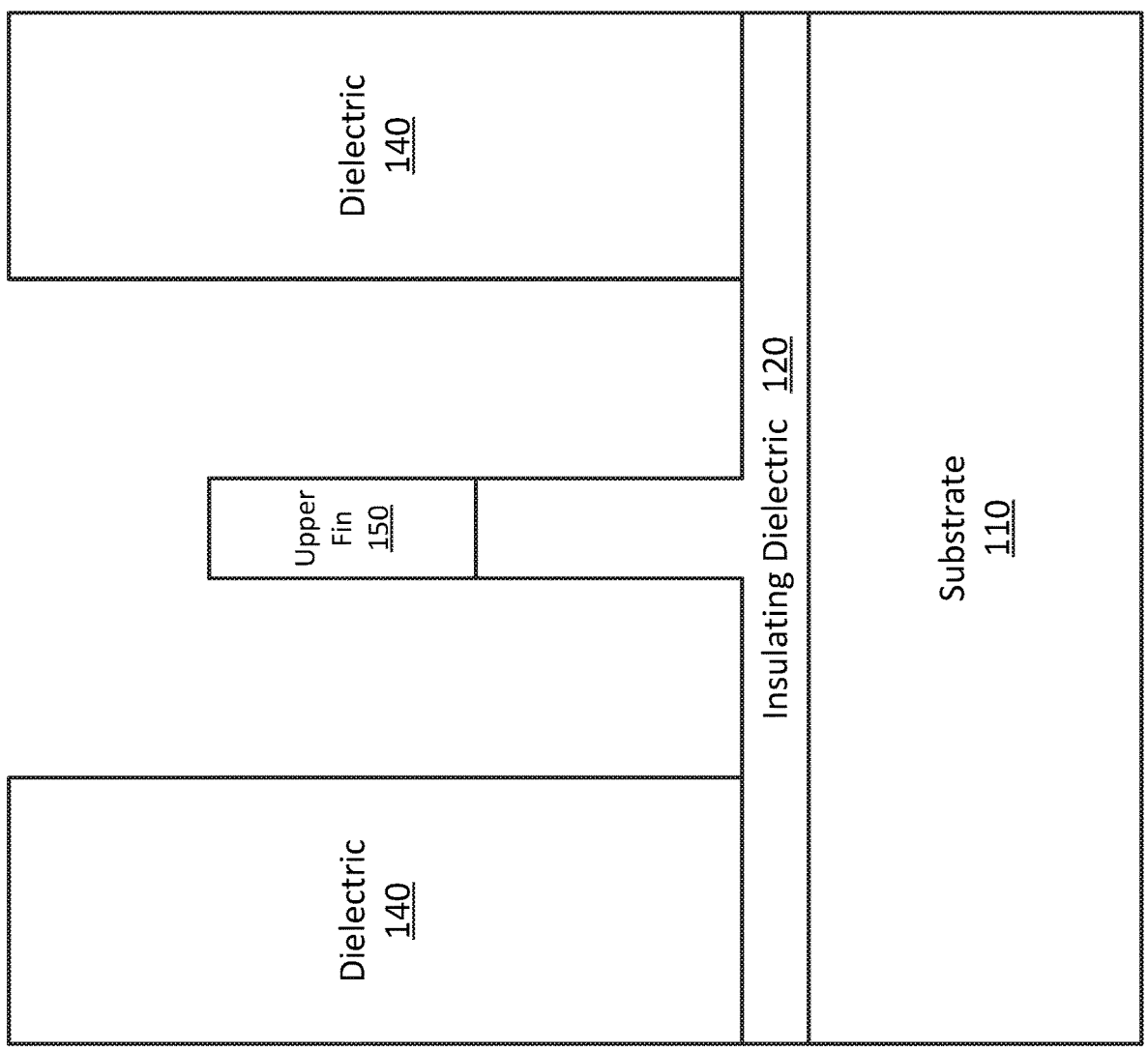
Figure 4D:
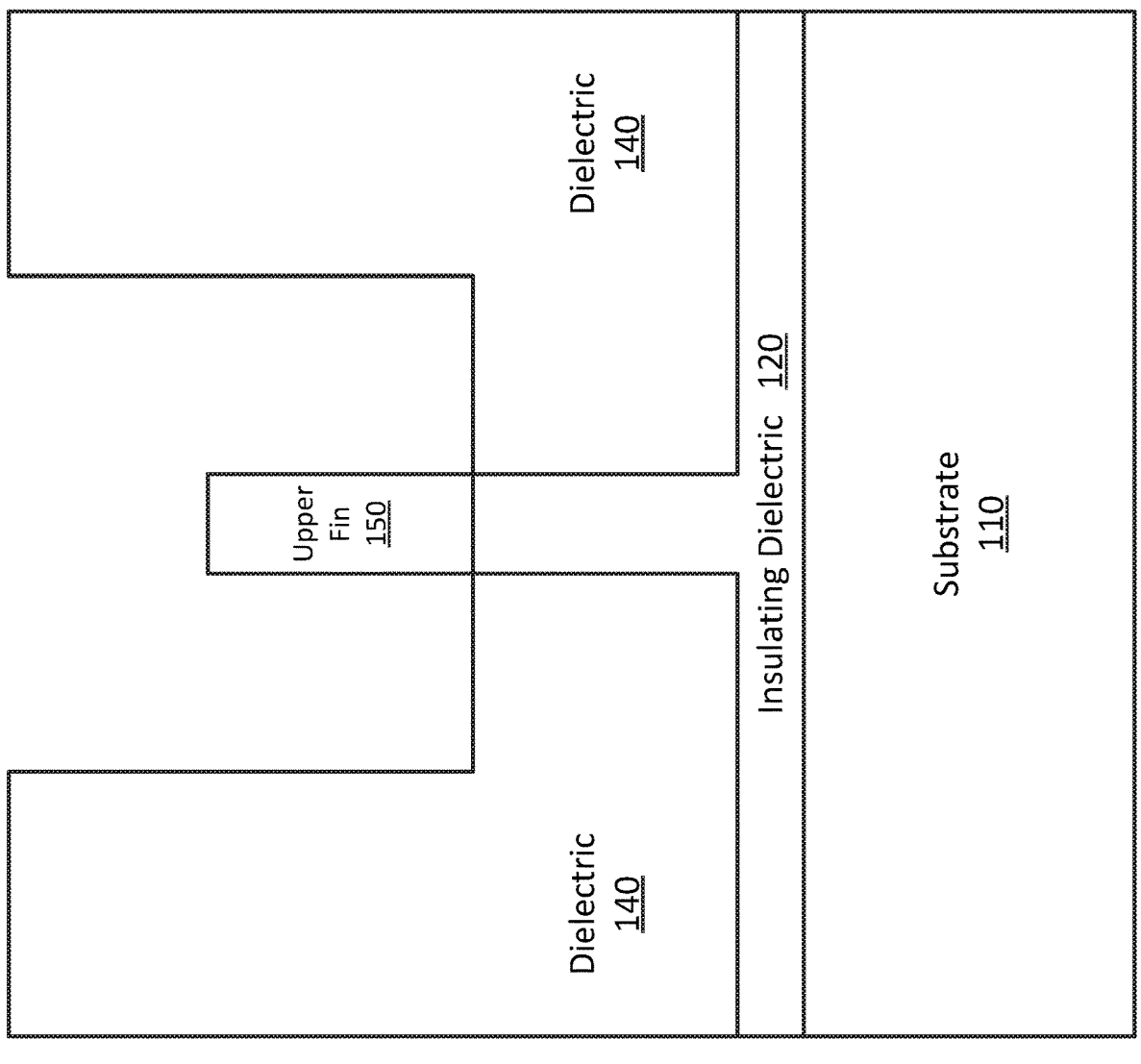

In one embodiment, $Al_2O_3$ is coated on a Si or SiGe lower fin 130, and the integrated circuit structure (e.g., the supporting assembly such as a wafer) is annealed. This causes the $Al_2O_3$-coated portions of the Si or SiGe lower fin 130 to oxidize. For example, the Si or SiGe can oxidize to one or more of silicon dioxide ($SiO_2$) and silicon-germanium (in some proportion) dioxide or a combination of silicon and germanium oxides, which severs the electrical connection between the lower fins 130. This is illustrated, for example, in FIGS. 4B-4C, where the insulating dielectric 120 is one or more of $SiO_2$ and $(Si-Ge)O_2$. After the conversion of the coated portions of the lower fin 130 to the insulating dielectric 120, processing can proceed similar to that of FIG. 2H. For instance, as illustrated in FIG. 4D, the evacuated gate structure and converted extension of insulating dielectric 120 is partially filled with the dielectric material 140 (e.g., $SiO_2$). The partial filling can cover the converted portion of the lower fin 130 (e.g., portion of the lower fin 130 converted to insulating dielectric 120) while not filling or covering the corresponding portion of the upper fin 150. Remaining processing can proceed similar to that of FIGS. 2J-2L on.

As discussed above, use of this technique can leave an insulating portion (electrically isolating the lower fins 130) whose width is comparable to the width of the corresponding gate structure in vertical alignment with the insulating portion. This is in contrast to the wet etch technique of FIGS. 2A-2H and 2J-2L, where the width of the insulating portion is wider than that of the vertically aligned gate structure. In addition, use of the technique of FIGS. 4A-4D can leave traces of the oxidation catalyst 135 (e.g., in the dielectric material 140) near the insulating portion, which further distinguishes detectable features of this technique from those of FIGS. 2A-2H and 2J-2L.

Figure 6:
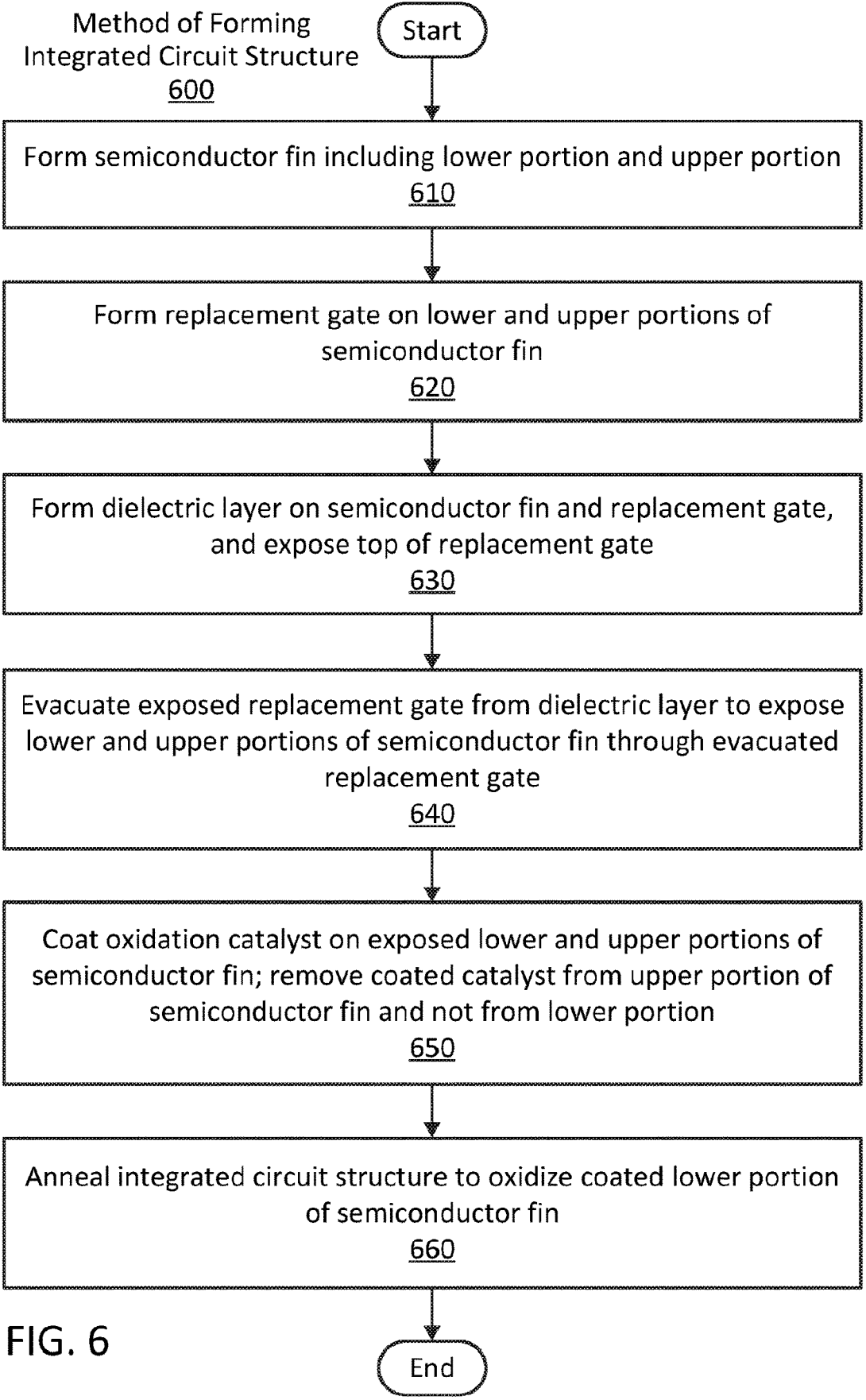

FIGS. 5-6 are flow diagrams of example methods 500-600 of fabricating integrated circuit structures, according to embodiments of the present disclosure. These and other methods disclosed herein may be carried out using integrated circuit fabrication techniques such as photolithography as would be apparent in light of the present disclosure. The corresponding transistors and other devices may be part of other (logic) devices on the same substrate, such as application specific integrated circuits (ASICs), microprocessors, central processing units, processing cores, and the like. Unless otherwise described herein, verbs such as "coupled" or "couple" refer to an electrical coupling (such as capable of transmitting an electrical signal, or electrically conductive), either directly or indirectly (such as through one or more conductive layers in between).

Referring to the method 500 of FIG. 5 (with specific example references to the structures or operations of FIGS. 1A-2H and 2J-4D), processing begins with forming 510 a semiconductor fin including a lower portion and an upper portion. (such as lower and upper fins 130 and 150), and forming 520 a replacement gate (or dummy gate structure, such as replacement gate 170) on the lower and upper portions (such as vertically aligned dummy gate regions of the lower and upper portions) of the semiconductor fin. Here, the dummy gate region of the lower portion is adjacent to and connects first and second regions of the lower portion, and the dummy gate region of the upper portion is adjacent to and connects first and second regions of the upper portion.

The method 500 further includes forming 530 a dielectric layer (such as dielectric material 140) on the semiconductor fin and dummy gate structure, planarizing the dielectric material to expose a top of the dummy gate structure, and evacuating 540 the exposed dummy gate structure from the dielectric layer to expose the dummy gate regions of the lower and upper portions of the semiconductor fin through the evacuated dummy gate structure. The method 500 further includes electrically isolating the first and second regions of the lower portion of the semiconductor fin at the exposed dummy gate region of the lower portion while leaving the first and second regions of the upper portion electrically unisolated at the exposed dummy gate region of the upper portion. For example, this electrical isolation can include etching 550 the exposed dummy gate regions of the lower and upper portions of semiconductor fin with an etchant that selectively etches the semiconductor material of the lower portion of the semiconductor fin and does not etch the semiconductor material of the upper portion, to remove the exposed dummy gate region of the lower portion of the semiconductor fin while leaving the exposed dummy gate region of the upper portion intact (as illustrated in FIGS. 2E-2F).

Referring to the method 600 of FIG. 6, processing begins with forming 610 a semiconductor fin including a lower portion and an upper portion, forming 620 a replacement gate on the lower and upper portions of the semiconductor fin, forming 630 a dielectric layer on the semiconductor fin and replacement gate, exposing a top of the replacement gate, and evacuating 640 the exposed replacement gate from the dielectric layer to expose the lower and upper portions of the semiconductor fin through the evacuated replacement gate. For example, these operations can be performed similar to those of operations 510-540 of the method 500 described above.

The method 600 further includes an electrical isolation of the first and second regions of the lower portion of the semiconductor fin at the exposed replacement (or dummy) gate region of the lower portion while leaving the first and second regions of the upper portion electrically unisolated at the exposed dummy gate region of the upper portion. However, unlike the selective etching 550 of the method 500, the method 600 includes coating 650 an oxidation catalyst (such as oxidation catalyst 135) on the exposed dummy gate region of the lower and upper portions of semiconductor fin; removing the coated oxidation catalyst from the dummy gate region of the upper portion of semiconductor fin while not removing the coated oxidation catalyst from the dummy gate region of the lower portion, and annealing 660 the integrated circuit structure to oxidize the coated dummy gate region of the lower portion of the semiconductor fin (as illustrated in FIGS. 4A-4C).

While the above example methods appear as a series of operations or stages, it is to be understood that there is no required order to the operations or stages unless specifically indicated.

Example System

Figure 7:
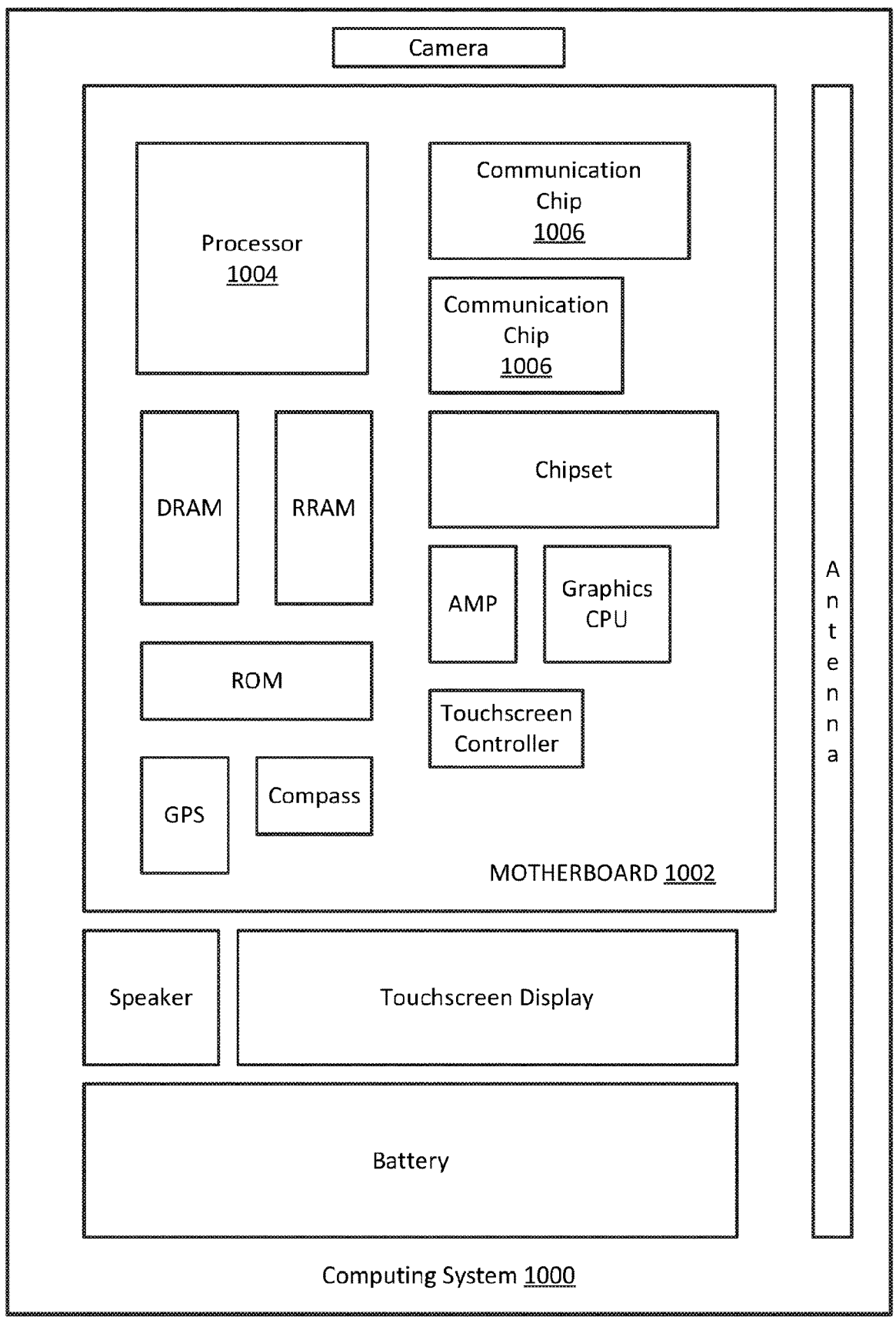
FIG. 7 illustrates an example computing system implemented with the integrated circuit structures or techniques disclosed herein, according to an embodiment of the present disclosure.

FIG. 7 illustrates a computing system 1000 implemented with the integrated circuit structures or techniques disclosed herein, according to an embodiment of the present disclosure. As can be seen, the computing system 1000 houses a motherboard 1002. The motherboard 1002 may include a number of components, including, but not limited to, a processor 1004 (including stacked transistor structures as described herein) and at least one communication chip 1006, each of which can be physically and electrically coupled to the motherboard 1002, or otherwise integrated therein. As will be appreciated, the motherboard 1002 may be, for example, any printed circuit board, whether a main board, a daughterboard mounted on a main board, or the only board of system 1000, to name a few examples.

Depending on its applications, computing system 1000 may include one or more other components that may or may not be physically and electrically coupled to the motherboard 1002. These other components may include, but are not limited to, volatile memory (e.g., DRAM), nonvolatile memory (e.g., read-only memory (ROM), resistive random-access memory (RRAM), and the like), a graphics processor, a digital signal processor, a crypto (or cryptographic) processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). Any of the components included in computing system 1000 may include one or more integrated circuit structures or devices (e.g., one or more stacked transistor structures) formed using the disclosed techniques in accordance with an example embodiment. In some embodiments, multiple functions can be integrated into one or more chips (e.g., for instance, note that the communication chip 1006 can be part of or otherwise integrated into the processor 1004).

The communication chip 1006 enables wireless communications for the transfer of data to and from the computing system 1000. The term "wireless" and its derivatives may be used to describe circuits, devices, systems, methods, techniques, communications channels, and the like, that may communicate data through the use of modulated electromagnetic radiation through a non-solid medium. The term does not imply that the associated devices do not contain any wires, although in some embodiments they might not. The communication chip 1006 may implement any of a number of wireless standards or protocols, including, but not limited to, Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing system 1000 may include a plurality of communication chips 1006. For instance, a first communication chip 1006 may be dedicated to shorter range wireless communications such as Wi-Fi and Bluetooth and a second communication chip 1006 may be dedicated to longer range wireless communications such as GPS, EDGE, GPRS, CDMA, WiMAX, LTE, Ev-DO, and others.

The processor 1004 of the computing system 1000 includes an integrated circuit die packaged within the processor 1004. In some embodiments, the integrated circuit die of the processor includes onboard circuitry that is implemented with one or more integrated circuit structures or devices (e.g., stacked transistor structures) formed using the disclosed techniques, as variously described herein. The term "processor" may refer to any device or portion of a device that processes, for instance, electronic data from registers and/or memory to transform that electronic data into other electronic data that may be stored in registers and/or memory.

The communication chip 1006 also may include an integrated circuit die packaged within the communication chip 1006. In accordance with some such example embodiments, the integrated circuit die of the communication chip includes one or more integrated circuit structures or devices (e.g., stacked transistor structures) formed using the disclosed techniques as variously described herein. As will be appreciated in light of this disclosure, note that multi-standard wireless capability may be integrated directly into the processor 1004 (e.g., where functionality of any chips 1006 is integrated into processor 1004, rather than having separate communication chips). Further note that processor 1004 may be a chip set having such wireless capability. In short, any number of processor 1004 and/or communication chips 1006 can be used. Likewise, any one chip or chip set can have multiple functions integrated therein.

In various implementations, the computing device 1000 may be a laptop, a netbook, a notebook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, a digital video recorder, or any other electronic device that processes data or employs one or more integrated circuit structures or devices (e.g., stacked transistor structures) formed using the disclosed techniques, as variously described herein.

Further Example Embodiments

The following examples pertain to further embodiments, from which numerous permutations and configurations will be apparent.

Example 1 is an integrated circuit (IC) structure including: a first portion of a bottom semiconductor fin extending horizontally in a length direction and vertically in a height direction; a second portion of the bottom semiconductor fin extending horizontally in the length direction and vertically in the height direction; a top semiconductor fin extending horizontally in the length direction and vertically in the height direction; and an insulator region extending horizontally in the length direction and to electrically insulate the first portion of the bottom semiconductor fin from the second portion of the bottom semiconductor fin, the insulator region further extending vertically in the height direction in vertical alignment with the top semiconductor fin, the insulator region including at least one of an insulator material and an airgap.

Example 2 includes the IC structure of Example 1, where the first portion of the bottom semiconductor fin is associated with a first transistor, the second portion of the bottom semiconductor fin is associated with a second transistor, the top semiconductor fin is associated with a third transistor, and the insulator region is further in vertical alignment with a gate electrode of the third transistor.

Example 3 includes the IC structure of any of Examples 1-2, where the insulator region includes at least one of an oxide, a nitride, and an oxynitride of a semiconductor material of the first and second portions of the bottom semiconductor fin.

Example 4 includes the IC structure of any of Examples 1-3, further including oxidation catalyst material adjacent to the insulator region.

Example 5 includes the IC structure of Example 4, where the oxidation catalyst material is configured to serve as a catalyst to oxidize a semiconductor material of the first and second portions of the bottom semiconductor fin.

Example 6 includes the IC structure of Example 5, where the semiconductor material of the first and second portions of the bottom semiconductor fin includes at least one of silicon and silicon germanium, and the oxidation catalyst material includes aluminum oxide.

Example 7 includes the IC structure of Example 1, where the first portion of the bottom semiconductor fin is associated with a first transistor, the second portion of the bottom semiconductor fin is associated with a second transistor, and the top semiconductor fin is associated with a third transistor, the third transistor including: a semiconductor region of the top semiconductor fin, the semiconductor region being in vertical alignment with the insulator region; source and drain regions on opposite sides of and adjacent to the semiconductor region; a gate dielectric on the semiconductor region; and a gate electrode on the gate dielectric.

Example 8 includes the IC structure of Example 7, where the insulator region is adjacent to the first and second portions of the bottom semiconductor fin, and the length of the semiconductor region is smaller than the length of the insulator region between the first and second portions of the bottom semiconductor fin.

Example 9 includes the IC structure of any of Examples 7-8, the first transistor including: a semiconductor region of the first portion of the bottom semiconductor fin; source and drain regions on opposite sides of and adjacent to the semiconductor region; a gate dielectric on the semiconductor region; and a gate electrode on the gate dielectric, where the source and drain regions of one of the first and third transistors is n-type, and the source and drain regions of the other of the first and third transistors is p-type.

Example 10 includes the IC structure of Example 9, where the one of the first and third transistors is an n-type metal oxide semiconductor (NMOS) transistor, the other of the first and third transistors is a p-type MOS (PMOS) transistor, and the NMOS and PMOS transistors make up a complementary MOS (CMOS) transistor structure.

Example 11 includes the IC structure of Example 10, where the semiconductor region of the NMOS transistor includes a Group III-V semiconductor and the semiconductor region of the PMOS transistor includes a Group IV semiconductor.

Example 12 includes the IC structure of any of Examples 10-11, where the semiconductor region of the NMOS transistor includes a nanowire structure having one or more semiconductor nanowires, and the semiconductor region of the PMOS transistor has a fin structure.

Example 13 includes the IC structure of Example 1, where the first portion of the bottom semiconductor fin is associated with a first transistor, the second portion of the bottom semiconductor fin is associated with a second transistor, the top semiconductor fin is associated with a third transistor, the IC structure further includes fourth and fifth transistors associated with the top semiconductor fin, and the third, fourth, and fifth transistors are connected in series, in parallel, or a combination of in series and in parallel.

Example 14 is a complementary metal oxide semiconductor (CMOS) integrated circuit (IC) including: a first transistor associated with a first portion of a bottom semiconductor fin and having one of n-type and p-type first source and drain regions, and a semiconductor region of the first portion of the bottom semiconductor fin adjacent to and connecting the first source and drain regions; a second transistor associated with a second portion of the bottom semiconductor fin in horizontal alignment with the first portion of the bottom semiconductor fin and having the one of n-type and p-type second source and drain regions, and a semiconductor region of the second portion of the bottom semiconductor fin adjacent to and connecting the second source and drain regions; an insulator region in horizontal alignment with and electrically separating the first and second transistors, the insulator region including at least one of an insulator material and an airgap; and a third transistor associated with a top semiconductor fin and having the other of n-type and p-type third source and drain regions, a semiconductor region of the top semiconductor fin adjacent to and connecting the third source and drain regions, a gate structure in vertical alignment with the insulator region, the gate structure including a gate dielectric on the semiconductor region, and a gate electrode on the gate dielectric.

Example 15 includes the CMOS IC of Example 14, where the insulator region is adjacent to the first and second portions of the bottom semiconductor fin, and a length of the semiconductor region of the top semiconductor fin is smaller than the length of the insulator region between the first and second portions of the bottom semiconductor fin.

Example 16 includes the CMOS IC of any of Examples 14-15, further including a fourth transistor associated with the top semiconductor fin and including: the other of n-type and p-type fourth source and drain regions; and a second semiconductor region of the top semiconductor fin adjacent to and connecting the fourth source and drain regions, and in vertical alignment with the semiconductor region of the first portion of the bottom semiconductor fin.

Example 17 includes the CMOS IC of Example 16, further including a fifth transistor associated with the top semiconductor fin and including: the other of n-type and p-type fifth source and drain regions; and a third semiconductor region of the top semiconductor fin adjacent to and connecting the fifth source and drain regions, and in vertical alignment with the semiconductor region of the second portion of the bottom semiconductor fin.

Example 18 includes the CMOS IC of Example 17, where the third transistor is configured to electrically connect the fourth and fifth transistors.

Example 19 includes the CMOS IC of any of Examples 14-18, where the insulator region includes at least one of an oxide, a nitride, and an oxynitride of the semiconductor regions of the first and second portions of the bottom semiconductor fin.

Example 20 includes the CMOS IC of any of Examples 14-19, further including oxidation catalyst material adjacent to the insulator region.

Example 21 includes the CMOS IC of Example 20, where the oxidation catalyst material is configured to serve as a catalyst to oxidize a semiconductor material of the semiconductor regions of the first and second portions of the bottom semiconductor fin.

Example 22 includes the CMOS IC of Example 21, where the semiconductor material of the semiconductor regions of the first and second portions of the bottom semiconductor fin includes at least one of silicon and silicon germanium, and the oxidation catalyst material includes aluminum oxide.

Example 23 includes the CMOS IC of any of Examples 14-22, where the one of the first and third transistors having the n-type source and drain regions is an NMOS transistor of a CMOS transistor structure, and the other one of first and third transistors is a PMOS transistor of the CMOS transistor structure.

Example 24 includes the CMOS IC of Example 23, where the semiconductor region of the NMOS transistor includes a different semiconductor material than the semiconductor region of the PMOS transistor.

Example 25 includes the CMOS IC of any of Examples 23-24, where the semiconductor region of the NMOS transistor includes a Group III-V semiconductor and the semiconductor region of the PMOS transistor includes a Group IV semiconductor.

Example 26 includes the CMOS IC of any of Examples 23-25, where the semiconductor region of the NMOS transistor includes a nanowire structure having one or more semiconductor nanowires, and the semiconductor region of the PMOS transistor has a fin structure.

Example 27 is a method of fabricating an integrated circuit (IC) structure, the method including: forming a semiconductor fin structure including a lower portion and an upper portion; forming a dummy gate structure on vertically aligned dummy gate regions of the lower and upper portions of the semiconductor fin structure, the dummy gate region of the lower portion being adjacent to and connecting first and second regions of the lower portion, and the dummy gate region of the upper portion being adjacent to and connecting first and second regions of the upper portion; depositing an insulator material on the semiconductor fin structure and dummy gate structure, and planarizing the insulator material to expose a top of the dummy gate structure; evacuating the exposed dummy gate structure to expose the dummy gate regions of the lower and upper portions of the semiconductor fin structure; and electrically isolating the first and second regions of the lower portion of the semiconductor fin structure at the exposed dummy gate region of the lower portion while leaving the first and second regions of the upper portion electrically unisolated at the exposed dummy gate region of the upper portion.

Example 28 includes the method of Example 27, where the electrically isolating of the first and second regions of the lower portion of the semiconductor fin structure includes removing the exposed dummy gate region of the lower portion while leaving the exposed dummy gate region of the upper portion intact.

Example 29 includes the method of any of Examples 27-28, where the lower portion of the semiconductor fin structure includes a different semiconductor material than the upper portion.

Example 30 includes the method of Example 29, where the semiconductor material of one of the lower and upper portions of the semiconductor fin structure is silicon, and the semiconductor material of the other is one of silicon germanium, germanium, and a III-V semiconductor.

Example 31 includes the method of Example 30, where the III-V semiconductor is gallium arsenide.

Example 32 includes the method of any of Examples 29-31, where the electrically isolating of the first and second regions of the lower portion of the semiconductor fin structure includes etching the exposed dummy gate regions of the lower and upper portions of the semiconductor fin structure with an etchant that selectively etches the semiconductor material of the lower portion and does not etch the semiconductor material of the upper portion, to remove the exposed dummy gate region of the lower portion while leaving the exposed dummy gate region of the upper portion intact.

Example 33 includes the method of any of Examples 27-31, where the electrically isolating of the first and second regions of the lower portion of the semiconductor fin structure includes oxidizing the exposed dummy gate region of the lower portion and not oxidizing the exposed dummy gate region of the upper portion, thereby converting the exposed dummy gate region of the lower portion to an insulator.

Example 34 includes the method of Example 33, where oxidizing the exposed dummy gate region of the lower portion includes: coating an oxidation catalyst on the exposed dummy gate regions of the lower and upper portions of the semiconductor fin structure; and removing the coated oxidation catalyst from the dummy gate region of the upper portion of the semiconductor fin structure while not removing the coated oxidation catalyst from the dummy gate region of the lower portion.

Example 35 includes the method of Example 34, where a semiconductor material of the lower portion of the semiconductor fin structure includes at least one of silicon and silicon germanium, and the oxidation catalyst includes aluminum oxide.

Example 36 includes the method of any of Examples 34-35, where oxidizing of the exposed dummy gate region of the lower portion of the semiconductor fin structure further includes annealing the IC structure to facilitate thermal oxidation of the coated dummy gate region of the lower portion.

Example 37 includes the method of any of Examples 33-36, further including removing the oxidized dummy gate region of the lower portion of the semiconductor fin structure.

Example 38 includes the method of any of Examples 27-37, further including forming an insulator layer in the evacuated dummy gate structure after electrically isolating the first and second regions of the lower portion of the semiconductor fin structure, to fill a portion of the evacuated dummy gate structure corresponding to the lower portion of the semiconductor fin structure.

Example 39 includes the method of Example 38, further including: forming a gate dielectric on the insulator layer to cover the exposed dummy gate region of the upper portion of the semiconductor fin structure, and forming a gate electrode on the gate dielectric to fill the evacuated dummy gate structure.

Example 40 includes the method of any of Examples 27-39, where electrically isolating the first and second regions of the lower portion of the semiconductor fin structure provides an electrical isolation between the first and second regions of the lower portion of the semiconductor fin structure, the method further including forming a first transistor associated with the first region of the lower portion of the semiconductor fin structure, and forming a second transistor associated with the second region of the lower portion, where the electrical isolation between the first and second regions of the lower portion electrically separates the first and second transistors.

Example 41 includes the method of Example 40, further including forming a third transistor associated with the first region of the upper portion of the semiconductor fin structure, and forming a fourth transistor associated with the second region of the upper portion, where the dummy gate region of the upper portion is configured to electrically connect the third and fourth transistors.

Example 42 includes the method of Example 41, where the first and second regions of the upper portion of the semiconductor fin structure are in vertical alignment with the first and second regions, respectively, of the lower portion of the semiconductor fin structure.

Example 43 includes the method of any of Examples 41-42, further including forming a gate structure on the dummy gate region of the upper portion of the semiconductor fin structure to fill the evacuated dummy gate structure and form a fifth transistor corresponding to the dummy gate region of the upper portion, where the fifth transistor is configured to control the electrical connection between the third and fourth transistors.

The foregoing description of example embodiments has been presented for the purposes of illustration and description. It is not intended to be exhaustive or to limit the present disclosure to the precise forms disclosed. Many modifications and variations are possible in light of this disclosure. It is intended that the scope of the present disclosure be limited not by this detailed description, but rather by the claims appended hereto. Future filed applications claiming priority to this application may claim the disclosed subject matter in a different manner, and may generally include any set of one or more limitations as variously disclosed or otherwise demonstrated herein.

What is claimed is:

1. An integrated circuit (IC) structure comprising:
   a fin structure comprising one or more semiconductor materials and extending horizontally in a length direction and vertically in a height direction, the fin structure including
      a first bottom portion extending horizontally in the length direction and vertically in the height direction,
      a second bottom portion extending horizontally in the length direction and vertically in the height direction,
      a top portion above the first and second bottom portions and extending horizontally in the length direction and vertically in the height direction, and
      a region below the top portion and extending horizontally in the length direction and to electrically insulate the first bottom portion from the second bottom portion, the region further extending vertically in the height direction in vertical alignment with the top portion, the region including an insulator material, a void, or both an insulator material and a void.

2. The IC structure of claim 1, wherein the first bottom portion of the fin structure is associated with a first transistor, the second bottom portion of the fin structure is associated with a second transistor, the top portion of the fin structure is associated with a third transistor, and the region is further in vertical alignment with a gate electrode of the third transistor.

3. The IC structure of claim 1, wherein the region comprises an oxide of a semiconductor material of the first and second bottom portions, a nitride of a semiconductor material of the first and second bottom portions, or an oxynitride of a semiconductor material of the first and second bottom portions.

4. The IC structure of claim 1, further comprising oxidation catalyst material adjacent to the region.

5. The IC structure of claim 4, wherein semiconductor material of the first and second bottom portions of the fin structure comprises at least one of silicon and germanium, and the oxidation catalyst material comprises aluminum and oxygen.

6. The IC structure of claim 1, wherein the first bottom portion of the fin structure is associated with a first transistor, the second bottom portion of the fin structure is associated with a second transistor, and the top portion of the fin structure is associated with a third transistor, the third transistor comprising:
   a semiconductor region of the top portion of fin structure, the semiconductor region being in vertical alignment with the region including the insulator material and/or void;
   a source region and a drain region on opposite sides of and adjacent to the semiconductor region;

a gate dielectric on the semiconductor region; and
a gate electrode on the gate dielectric.

7. The IC structure of claim 6, wherein the region including the insulator material and/or void is adjacent to the first and second bottom portions of the fin structure, and the length of the semiconductor region is smaller than the length of the region including the insulator material and/or void.

8. The IC structure of claim 6, the first transistor comprising:
a semiconductor region of the first bottom portion of the fin structure;
a source region and a drain region on opposite sides of and adjacent to the semiconductor region of the first bottom portion;
a gate dielectric on the semiconductor region of the first bottom portion; and
a gate electrode on the gate dielectric;
wherein the source and drain regions of one of the first and third transistors are n-type, and the source and drain regions of the other of the first and third transistors are p-type.

9. The IC structure of claim 8, wherein
the one of the first and third transistors is an n-type metal oxide semiconductor (NMOS) transistor,
the other of the first and third transistors is a p-type MOS (PMOS) transistor, and
the NMOS and PMOS transistors make up a complementary MOS (CMOS) transistor structure.

10. The IC structure of claim 9, wherein the semiconductor region of the NMOS transistor comprises a Group III-V semiconductor and the semiconductor region of the PMOS transistor comprises a Group IV semiconductor.

11. The IC structure of claim 9, wherein the semiconductor region of the NMOS transistor and/or the semiconductor region of the PMOS transistor comprises one or more semiconductor nanowires.

12. The IC structure of claim 1, wherein the first bottom portion of the fin structure is associated with a first transistor, the second bottom portion of the fin structure is associated with a second transistor, and the top portion of the fin structure is associated with third transistor, and wherein the IC structure further comprises fourth and fifth transistors, and the third, fourth, and fifth transistors are connected in series, in parallel, or a combination of in series and in parallel.

13. A complementary metal oxide semiconductor (CMOS) integrated circuit (IC) comprising:
a first transistor associated with a bottom portion of a fin structure, the first transistor having one of n-type or p-type first source and drain regions, wherein a semiconductor region of the first bottom portion of the fin structure is adjacent to and connecting the first source and drain regions;
a second transistor associated with a second bottom portion of the fin structure in horizontal alignment with the first bottom portion of the fin structure, the second transistor having the one of n-type and p-type second source and drain regions, wherein a semiconductor region of the second bottom portion of the fin structure is adjacent to and connecting the second source and drain regions;
a third transistor associated with a top portion of the fin structure, the third transistor having the other of n-type and p-type third source and drain regions, wherein a semiconductor region of the top portion of the fin structure is adjacent to and connecting the third source and drain regions, the third transistor further including a gate structure on the semiconductor region of the top portion; and
a region of electrical isolation below the top portion and in vertical alignment with the gate structure of the third transistor, the region of electrical isolation in horizontal alignment with and electrically separating the first and second bottom portions of the fin structure, the region of electrical isolation including an insulator material, a void, or both an insulator material and a void.

14. The CMOS IC of claim 13, wherein the region of electrical isolation is adjacent to the first and second bottom portions of the fin structure, and a length of the semiconductor region of the top portion of the fin structure is smaller than the length of the region of electrical isolation between the first and second bottom portions of the fin structure.

15. The CMOS IC of claim 13, wherein the region of electrical isolation comprises an oxidized portion of the fin structure.

16. The CMOS IC of claim 13, further comprising oxidation catalyst material adjacent to the region of electrical isolation.

17. An integrated circuit (IC) structure comprising:
a layer of insulation material;
a fin structure above the layer of insulation material, the fin structure comprising one or more semiconductor materials and extending horizontally in a length direction and vertically in a height direction, the fin structure including
a first bottom portion extending horizontally in the length direction and vertically in the height direction,
a second bottom portion extending horizontally in the length direction and vertically in the height direction, the second bottom portion horizontally aligned with the first bottom portion,
a top portion above and vertically aligned with the first and second bottom portions and extending horizontally in the length direction and vertically in the height direction, and
a region below and vertically aligned with the top portion, the region extending between and horizontally aligned with the first and second bottom portions, wherein the region is in contact with the layer of isolation and extends to the top portion, the region including an insulator material, a void, or both an insulator material and a void.

18. The IC structure of claim 17, wherein the top portion of the fin structure is associated with a transistor, and the region is further in vertical alignment with a gate electrode of the transistor.

19. The IC structure of claim 17, wherein the first and second bottom portions of the fin structure comprise a first semiconductor material, and the top portion of the fin structure comprises a second semiconductor material that is compositionally different from the first semiconductor material.

20. The IC structure of claim 17, wherein the region comprises an oxide of the first semiconductor material, a nitride of the first semiconductor material, or an oxynitride of the first semiconductor material.

* * * * *